United States Patent
Hirose et al.

(10) Patent No.: US 11,158,675 B2
(45) Date of Patent: Oct. 26, 2021

(54) SOLID-STATE IMAGING ELEMENT AND SOLID-STATE IMAGING APPARATUS

(71) Applicants: SONY CORPORATION, Tokyo (JP); SONY SEMICONDUCTOR SOLUTIONS CORPORATION, Kanagawa (JP)

(72) Inventors: Yohei Hirose, Tokyo (JP); Iwao Yagi, Kanagawa (JP); Shintarou Hirata, Tokyo (JP); Hideaki Mogi, Kanagawa (JP); Masashi Bando, Kanagawa (JP); Osamu Enoki, Kanagawa (JP)

(73) Assignees: Sony Corporation, Tokyo (JP); Sony Semiconductor Solutions Corporation, Kanagawa (JP)

( * ) Notice: Subject to any disclaimer, the term of this patent is extended or adjusted under 35 U.S.C. 154(b) by 6 days.

(21) Appl. No.: 16/316,999

(22) PCT Filed: Jul. 20, 2017

(86) PCT No.: PCT/JP2017/026243
§ 371 (c)(1),
(2) Date: Jan. 10, 2019

(87) PCT Pub. No.: WO2018/016570
PCT Pub. Date: Jan. 25, 2018

(65) Prior Publication Data
US 2019/0319071 A1    Oct. 17, 2019

(30) Foreign Application Priority Data

Jul. 20, 2016 (JP) .............................. JP2016-142154
Aug. 8, 2016 (JP) .............................. JP2016-155728

(51) Int. Cl.
*H01L 51/00* (2006.01)
*H01L 27/30* (2006.01)
(Continued)

(52) U.S. Cl.
CPC ........ *H01L 27/307* (2013.01); *H01L 51/4273* (2013.01); *H01L 51/442* (2013.01); *H04N 5/369* (2013.01); *H01L 2251/558* (2013.01)

(58) Field of Classification Search
CPC .......................... H01L 51/4273; H01L 27/307
See application file for complete search history.

(56) References Cited

U.S. PATENT DOCUMENTS

| 2007/0063156 | A1  | 3/2007 | Hayashi |
| 2008/0035965 | A1* | 2/2008 | Hayashi ................ H01L 27/307 257/291 |

(Continued)

FOREIGN PATENT DOCUMENTS

| CN | 104934538 | 9/2015 |
| CN | 105261702 | 1/2016 |

(Continued)

OTHER PUBLICATIONS

International Search Report prepared by the Japan Patent Office dated Oct. 3, 2017, for International Application No. PCT/JP2017/026243.

(Continued)

*Primary Examiner* — Samuel A Gebremariam
(74) *Attorney, Agent, or Firm* — Sheridan Ross P.C.

(57) ABSTRACT

A first solid-state imaging element according to an embodiment of the present disclosure includes a bottom-electrode; a top-electrode opposed to the bottom-electrode; a photoelectric conversion layer provided between the bottom-electrode and the top-electrode and including a first organic semiconductor material; and an—upper inter-layer provided between the top-electrode and the photoelectric conversion layer, and including a second organic semiconductor mate- (Continued)

rial having a halogen atom in a molecule at a concentration in a range from 0 volume % or more to less than 0.05 volume %.

13 Claims, 23 Drawing Sheets

(51) Int. Cl.
*H01L 51/42* (2006.01)
*H01L 51/44* (2006.01)
*H04N 5/369* (2011.01)

(56) References Cited

U.S. PATENT DOCUMENTS

| | | |
|---|---|---|
| 2015/0060773 A1 | 3/2015 | Liang et al. |
| 2015/0270315 A1 | 9/2015 | Takasu et al. |
| 2015/0325797 A1 | 11/2015 | Choi et al. |
| 2016/0020258 A1 | 1/2016 | Park et al. |
| 2017/0054089 A1 | 2/2017 | Obana et al. |

FOREIGN PATENT DOCUMENTS

| | | | | |
|---|---|---|---|---|
| JP | 2007-088033 | | 4/2007 | |
| JP | 2009-267169 | | 11/2009 | |
| JP | 2012-019235 | | 1/2012 | |
| JP | 2014-022525 | | 2/2014 | |
| JP | 2015130480 | * | 6/2014 | ........... Y02E 10/549 |
| JP | 2015-195333 | | 11/2015 | |
| JP | 2015-233117 | | 12/2015 | |
| JP | 2016-025342 | | 2/2016 | |
| WO | WO 2014/055976 | | 4/2014 | |
| WO | WO 2014/085639 | | 6/2014 | |
| WO | WO 2015/170219 | | 11/2015 | |
| WO | WO 2015/174010 | | 11/2015 | |
| WO | WO-2015174010 A1 | * | 11/2015 | ............. C09B 48/00 |

OTHER PUBLICATIONS

Extended European Search Report for European Patent Application No. 17831086.8, dated Jun. 28, 2019, 9 pages.
Official Action (with English translation) for Japan Patent Application No. 2016-142154, dated Jan. 19, 2021, 6 pages.
Official Action for Taiwan Patent Application No. 106124447, dated Mar. 29, 2021, 13 pages.

* cited by examiner

[ FIG. 1 ]
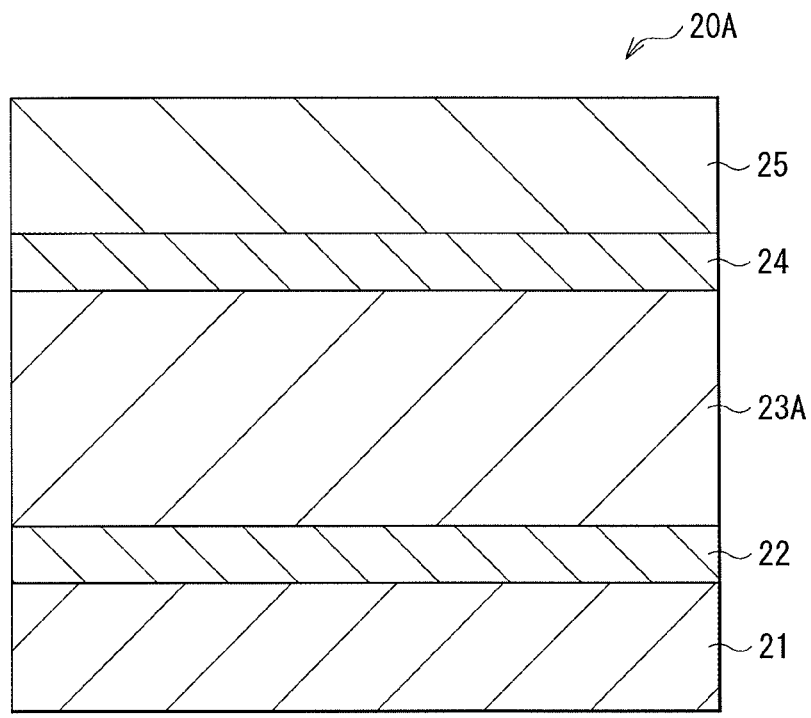

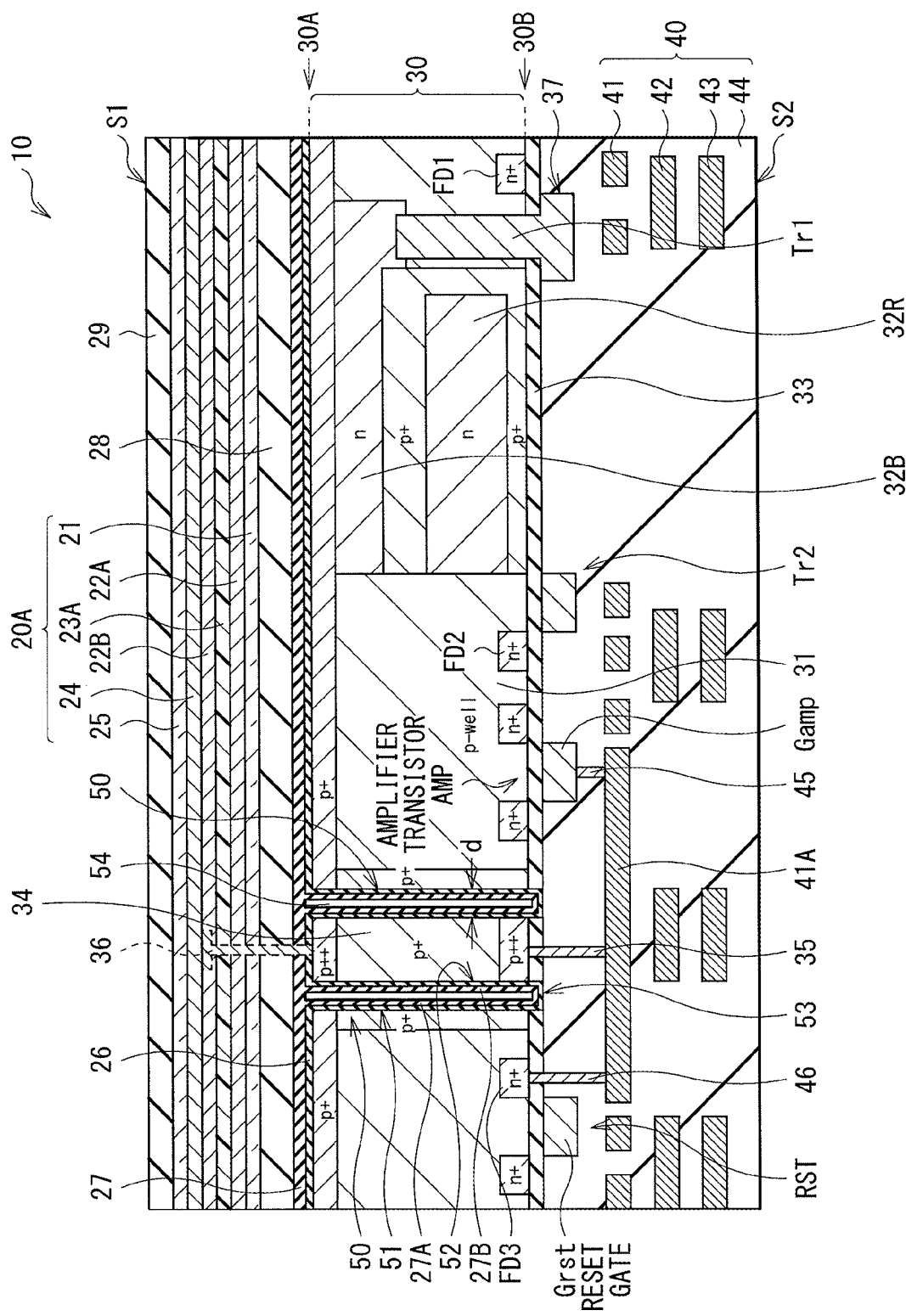
[FIG. 2]

[ FIG. 3A ]
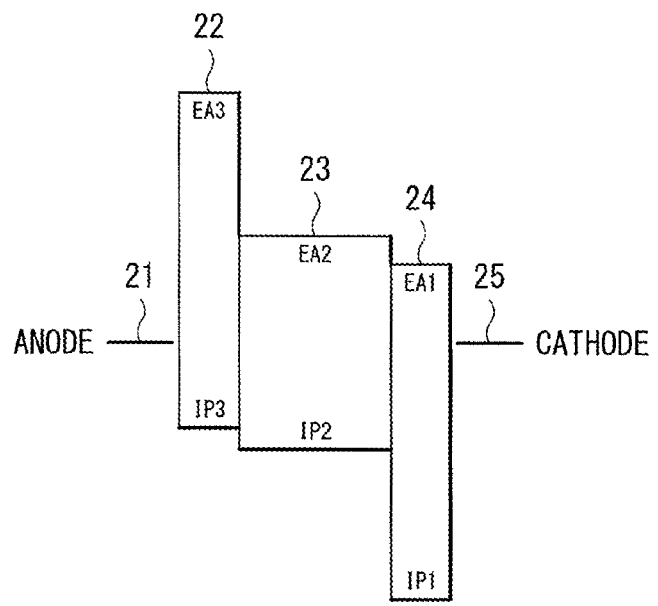
[ FIG. 3B ]
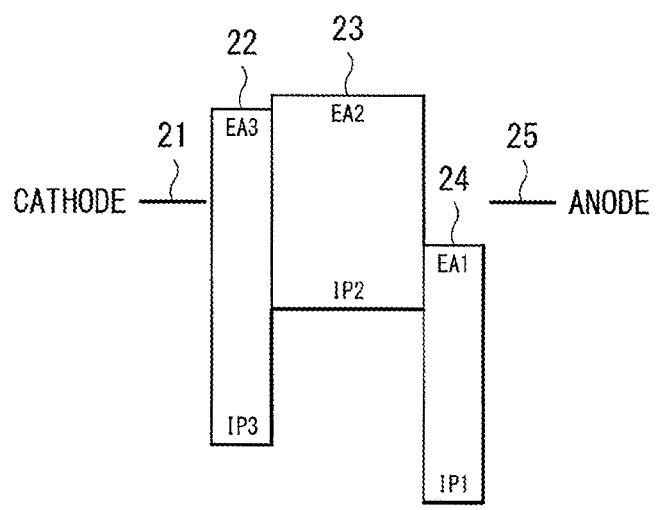

[ FIG. 4 ]
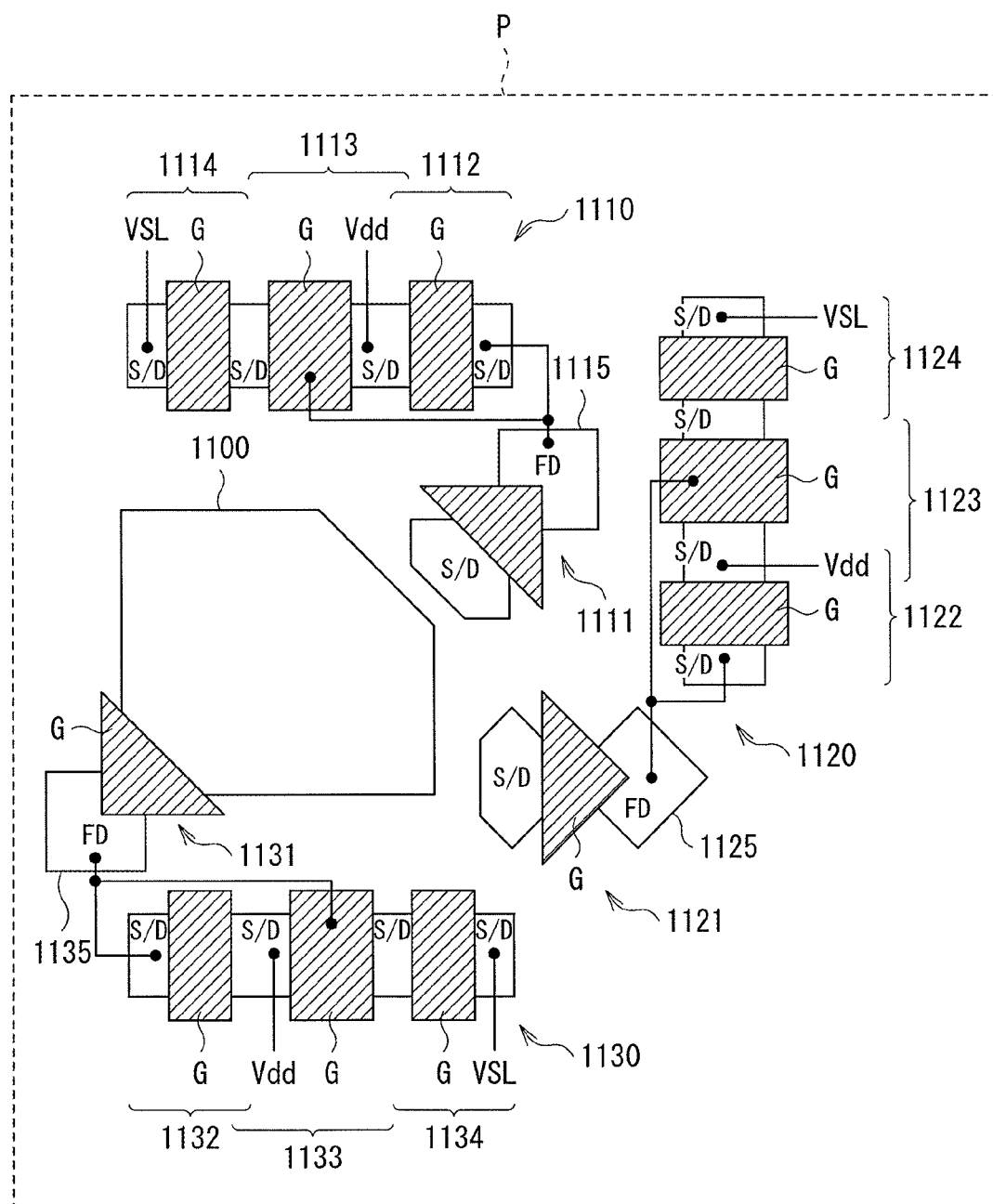

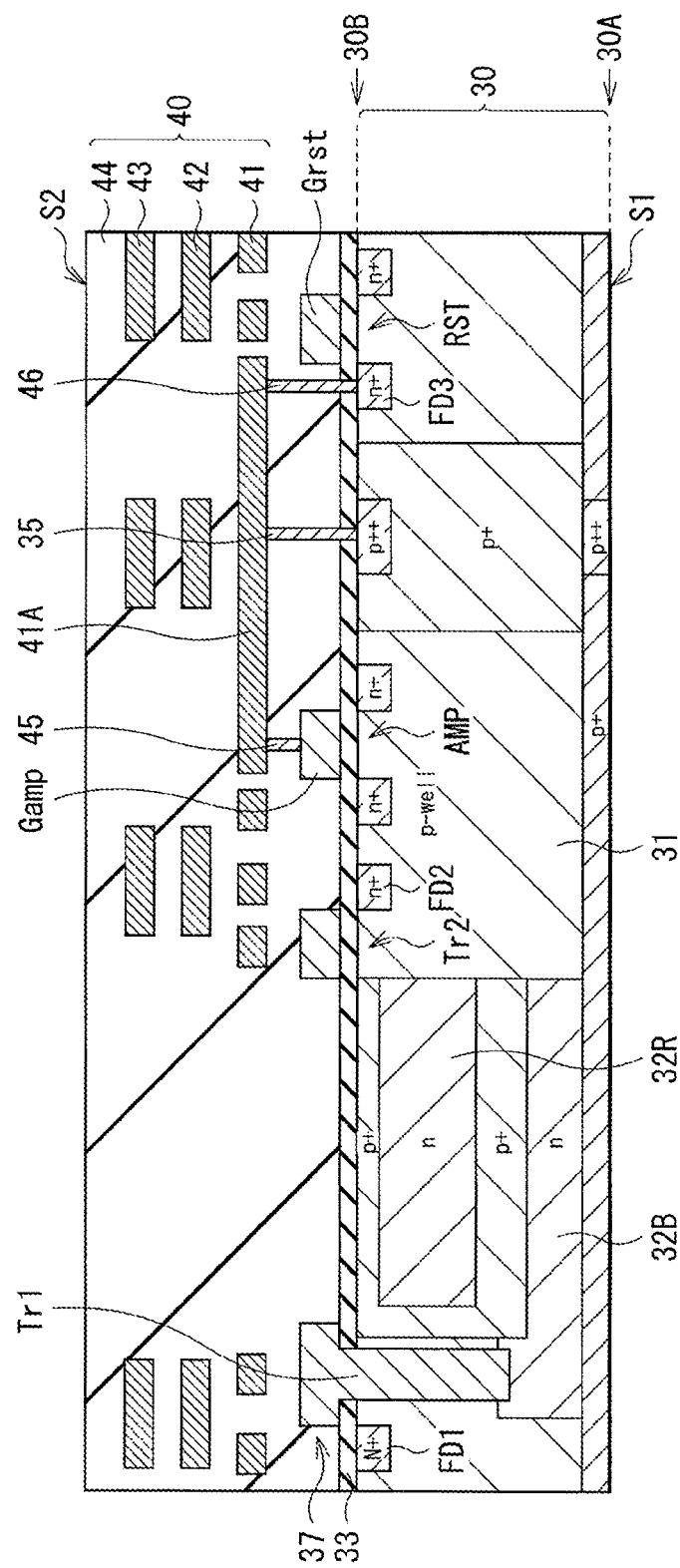

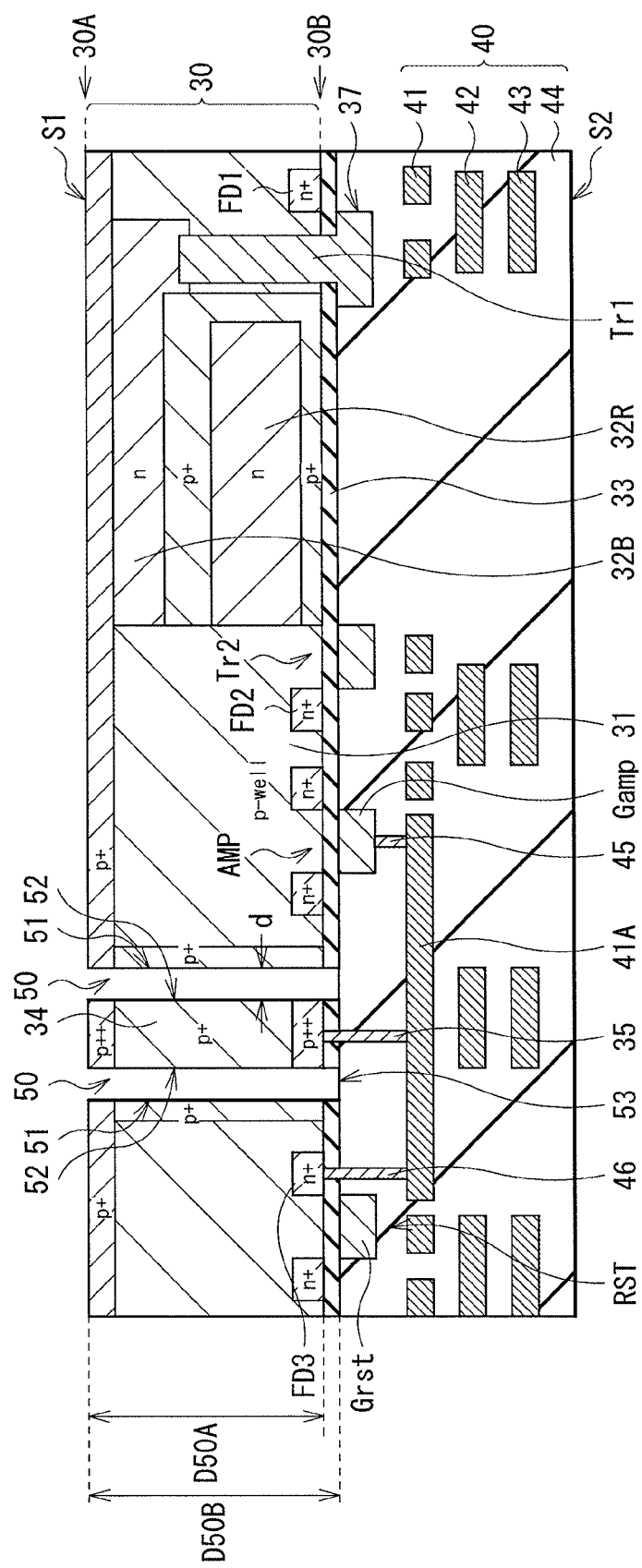
[FIG. 6]

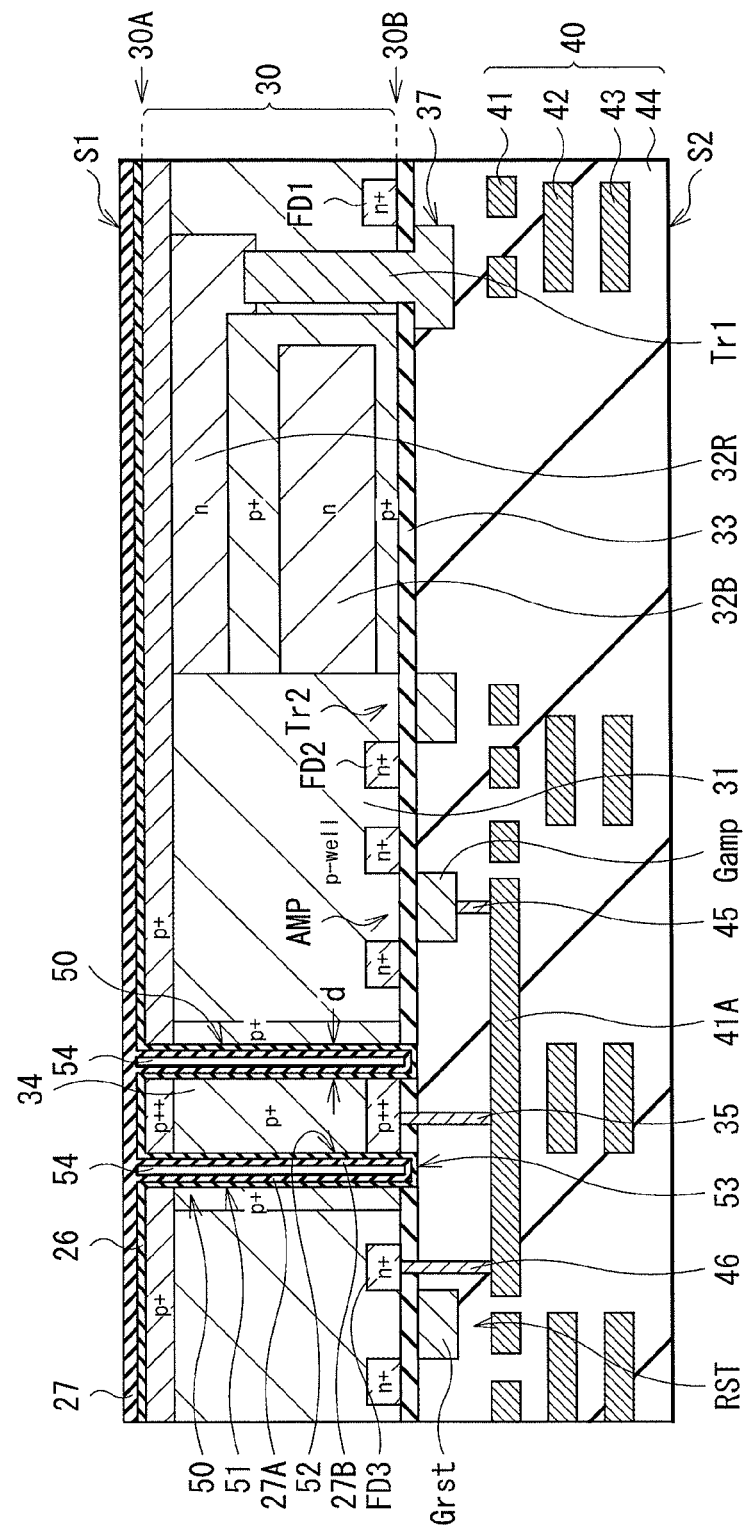
[FIG. 7]

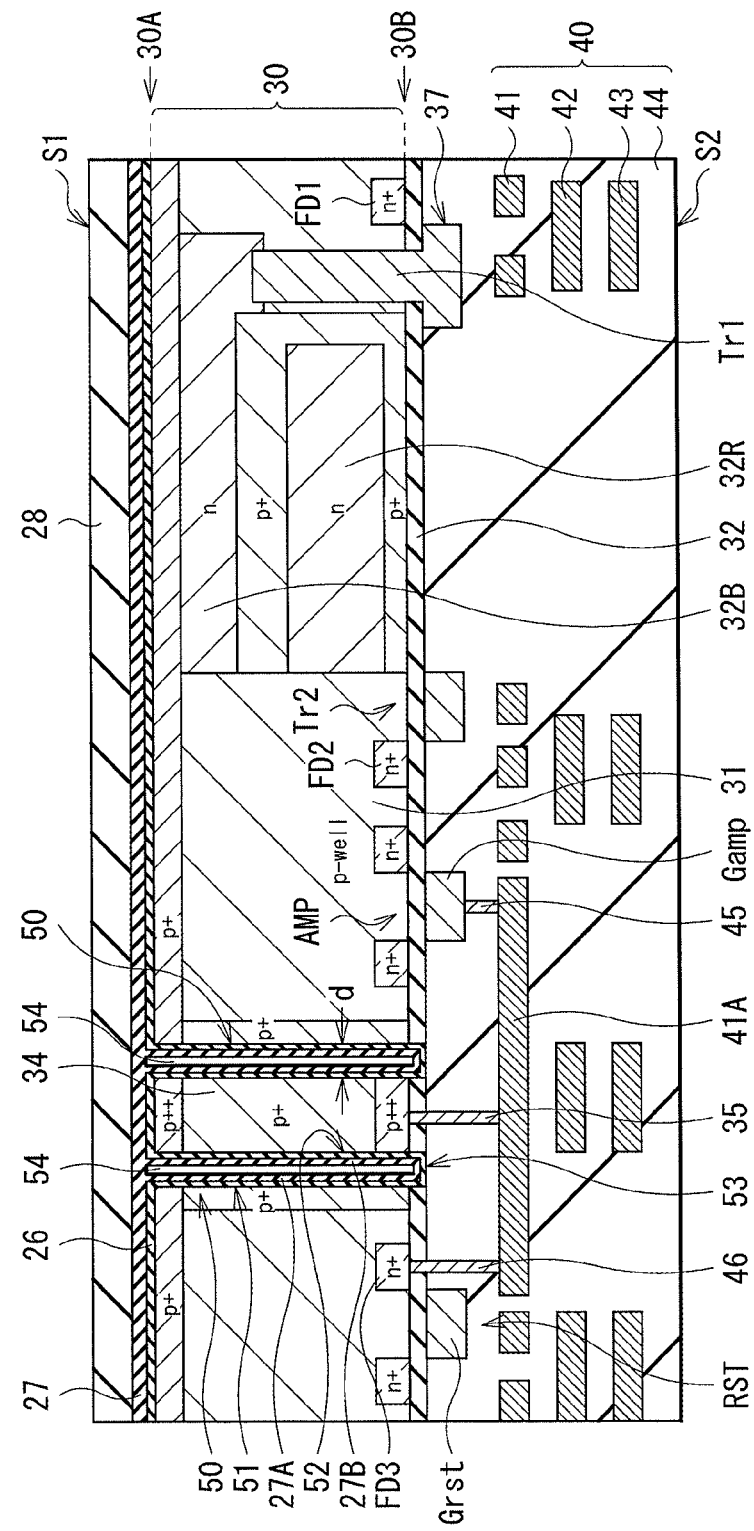
[FIG. 8]

[ FIG. 9 ]
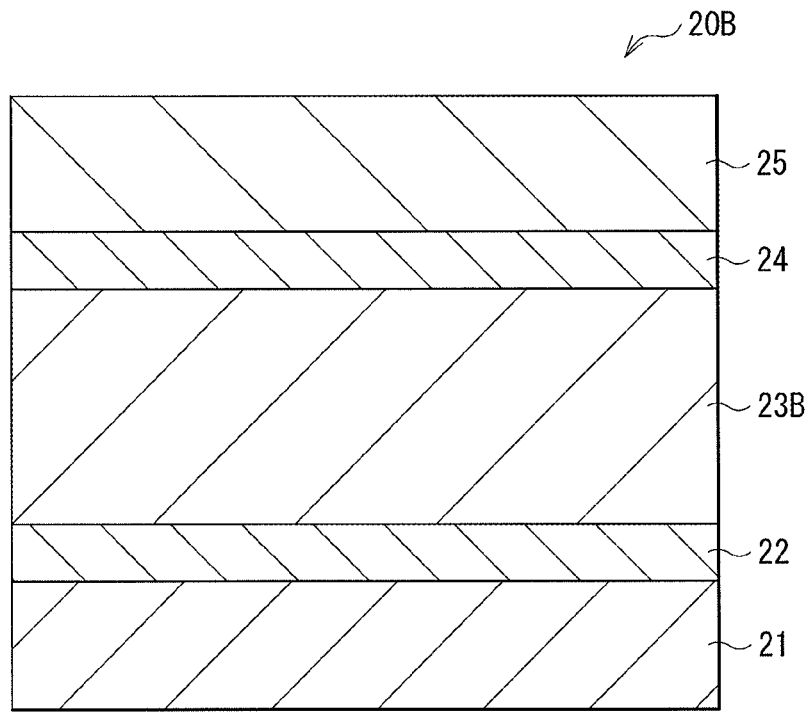
[ FIG. 10 ]
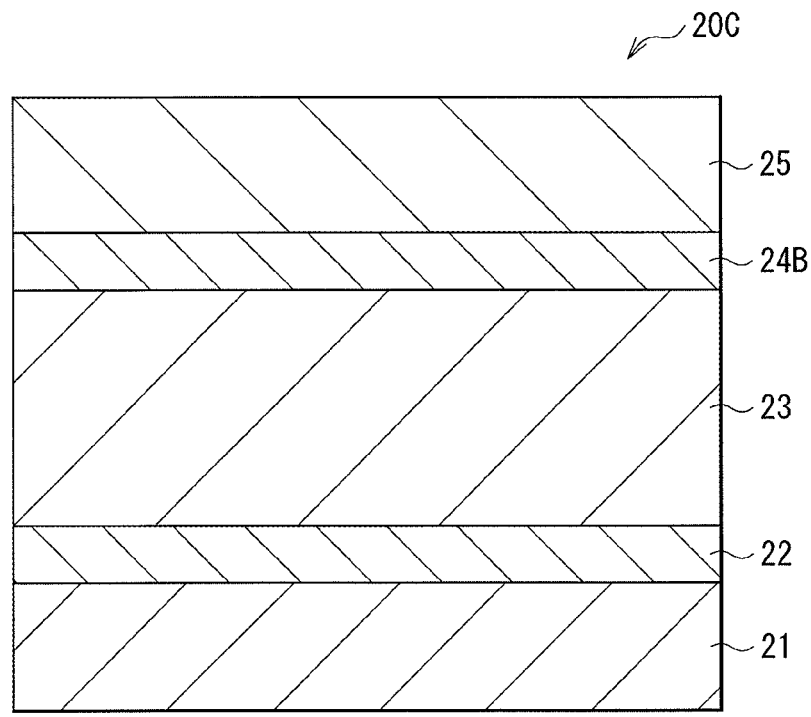

[ FIG. 11 ]
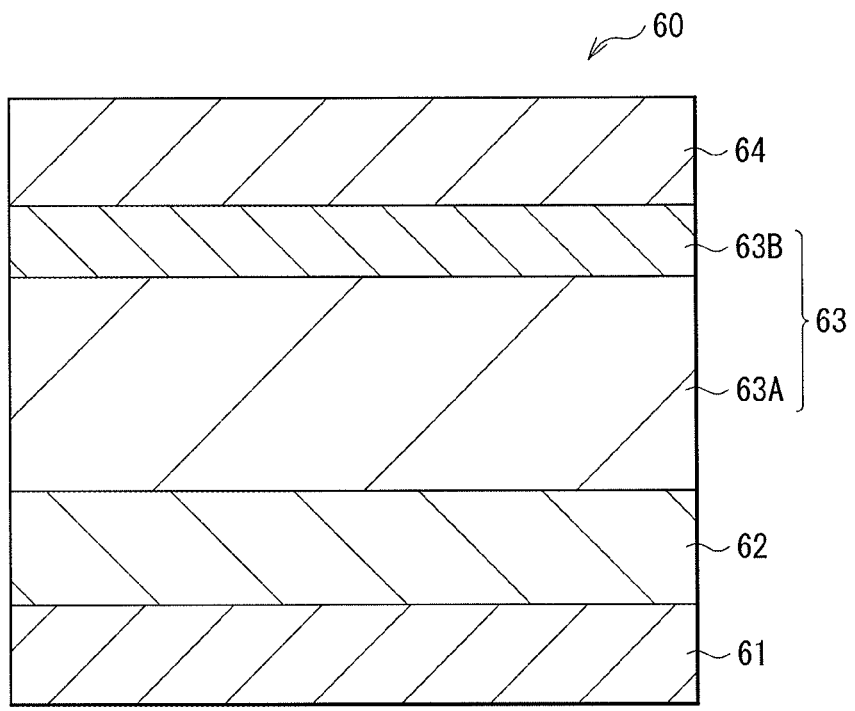

[ FIG. 12A ]
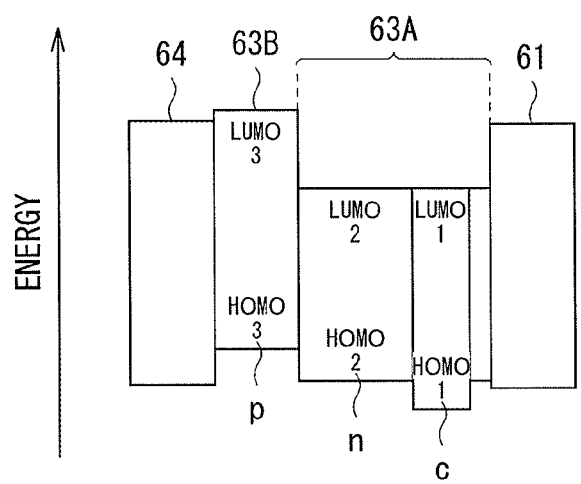
[ FIG. 12B ]
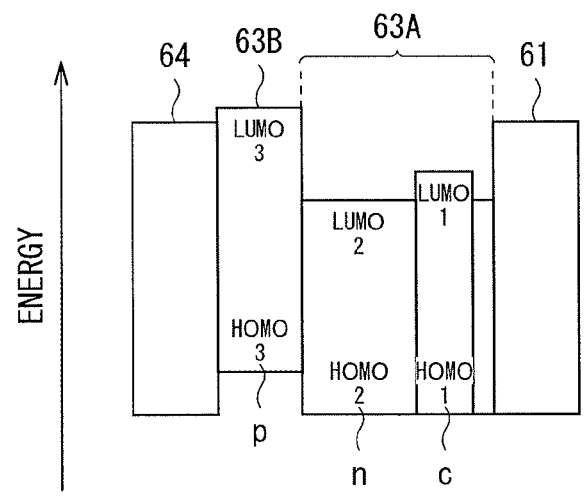

[ FIG. 13A ]
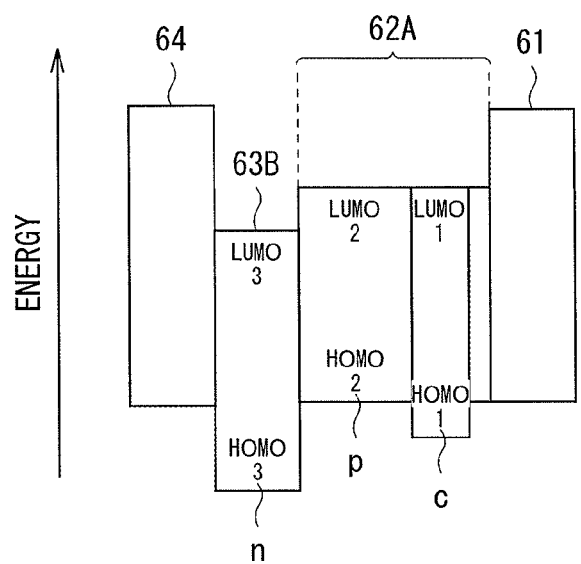
[ FIG. 13B ]
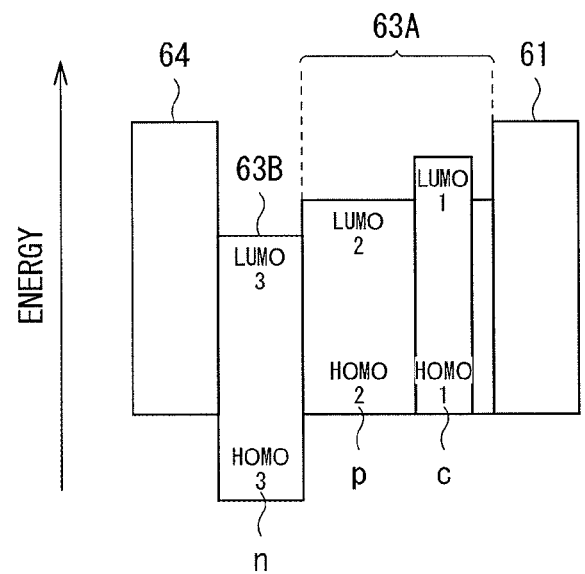

[ FIG. 14 ]
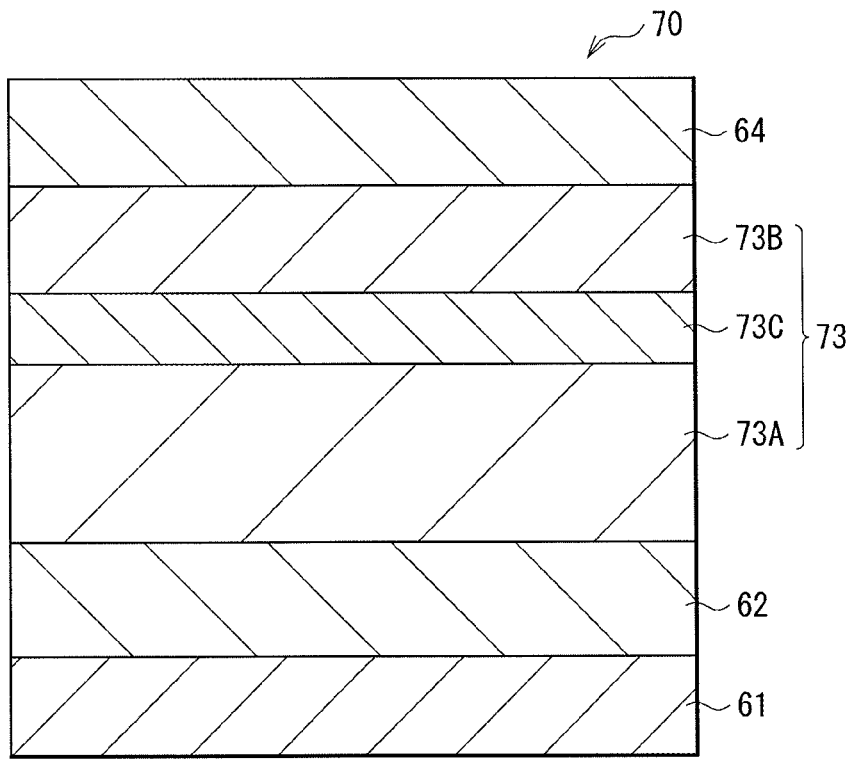
[ FIG. 15 ]
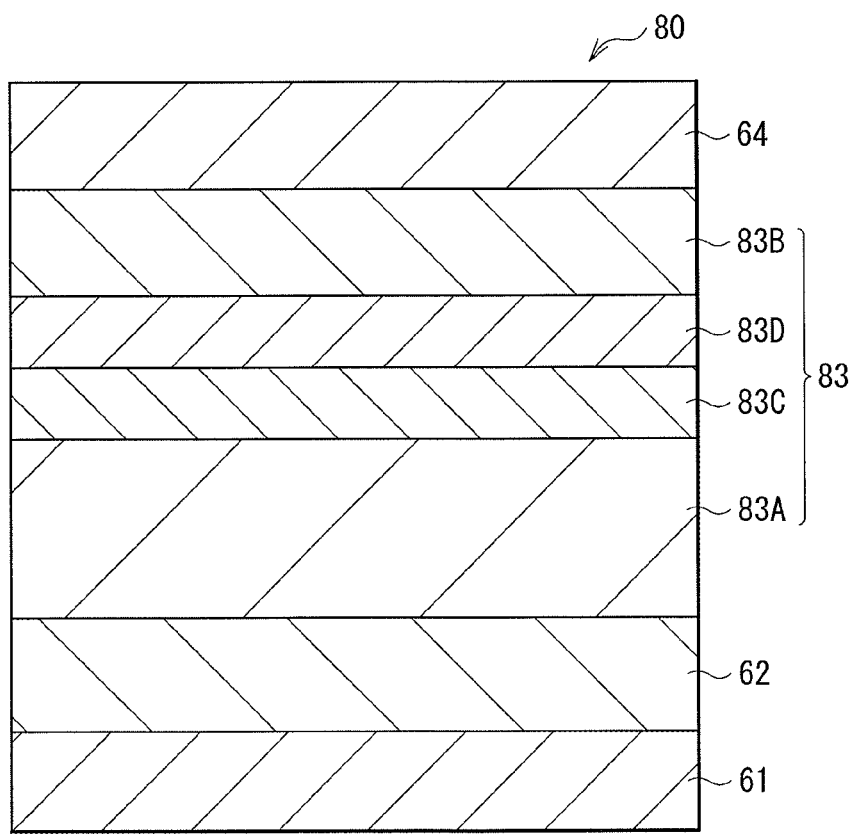

[ FIG. 16 ]
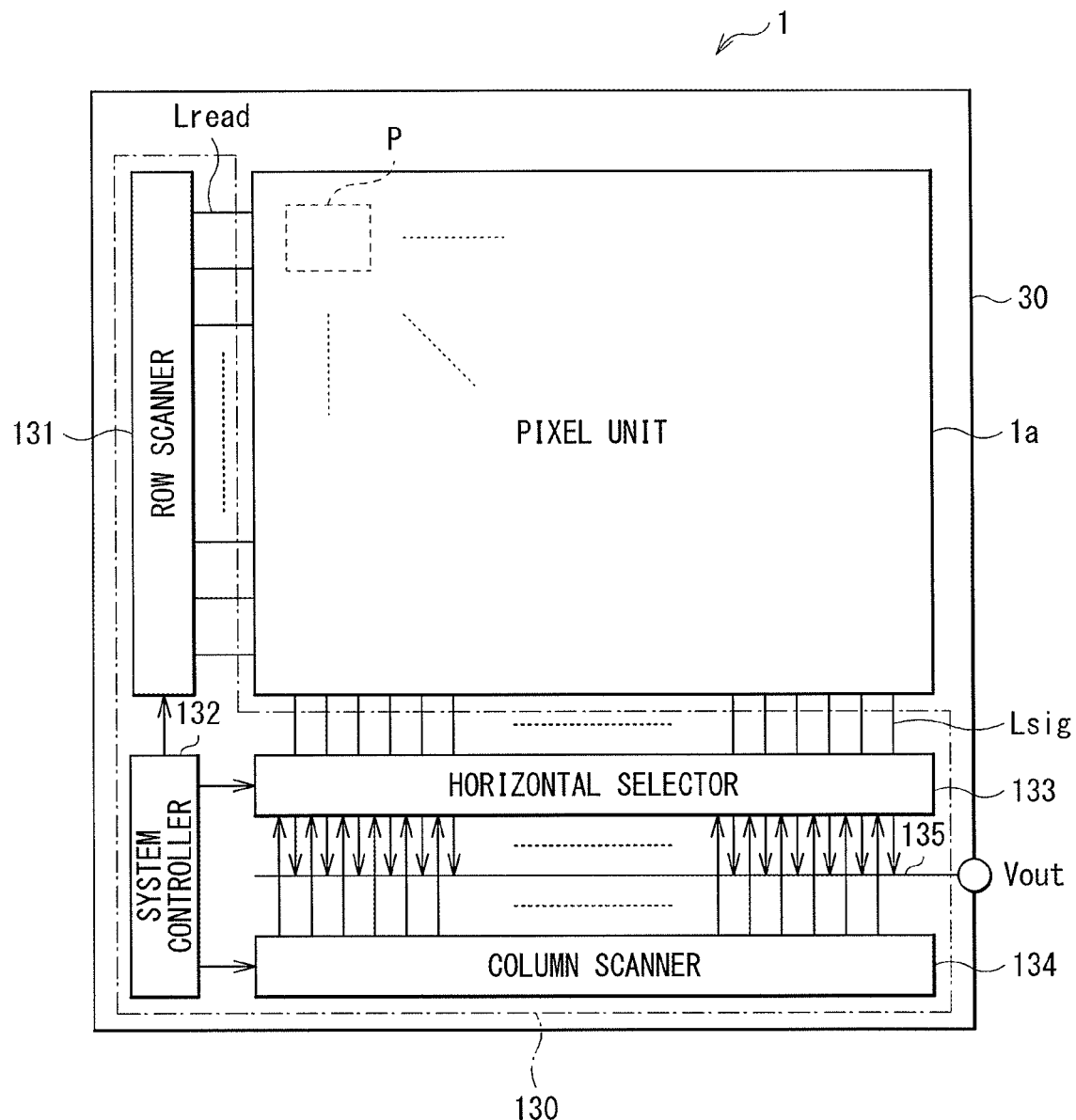

[ FIG. 17 ]
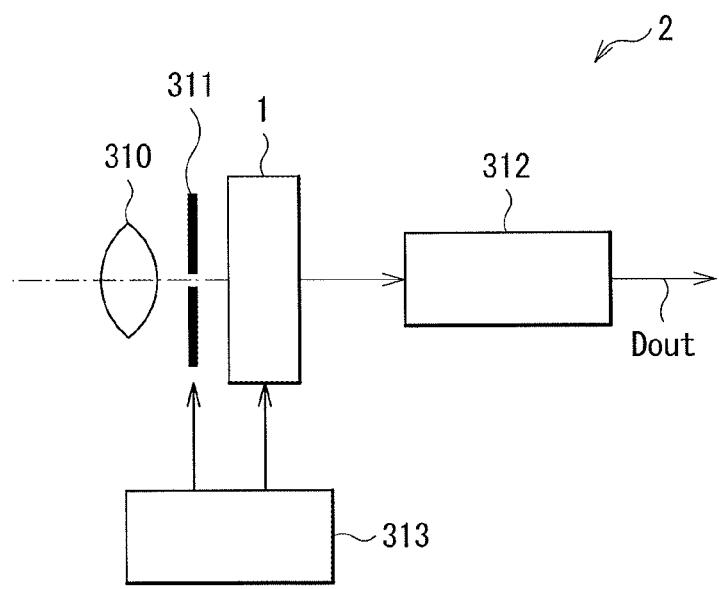

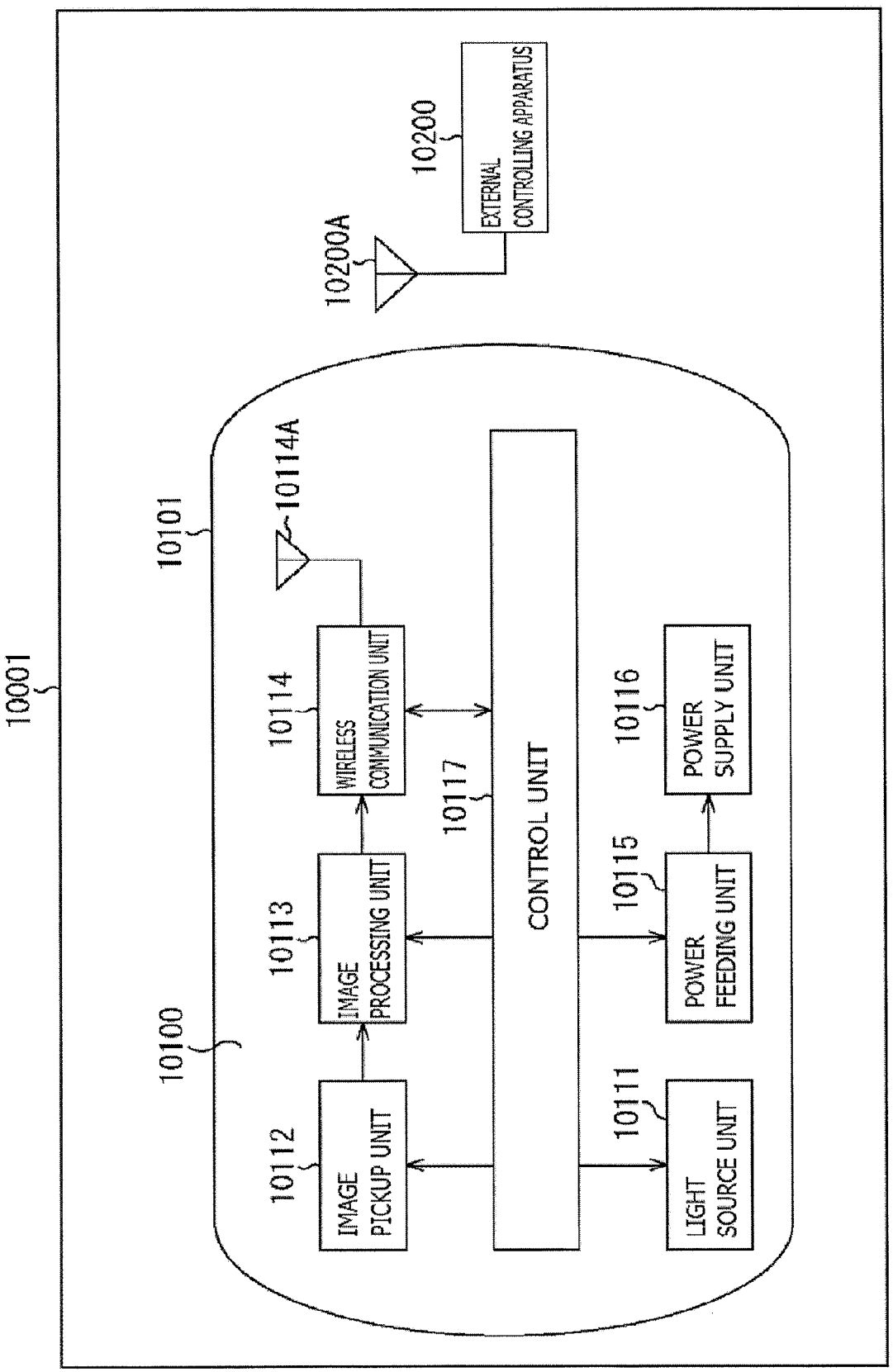

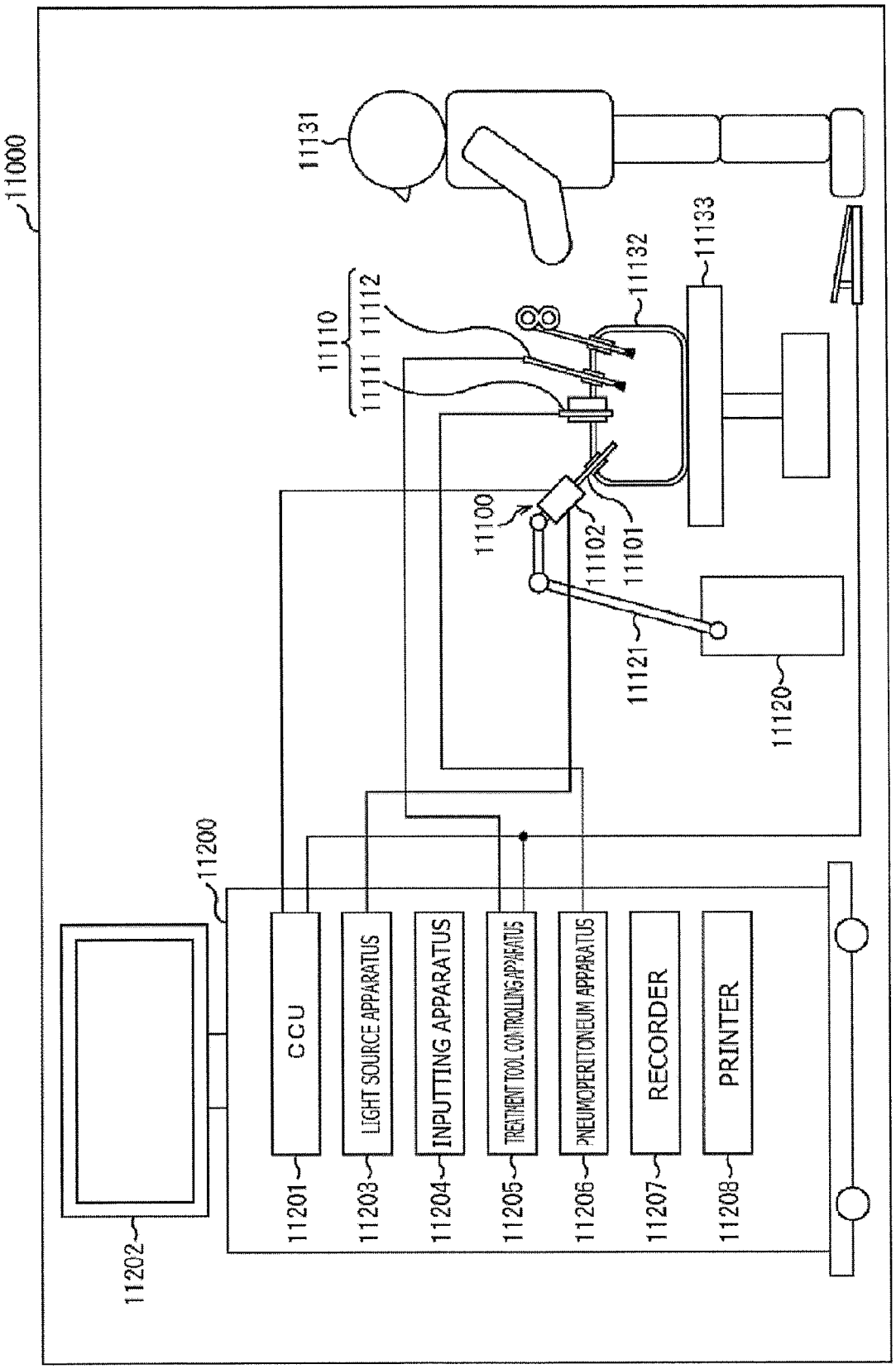
[FIG. 19]

[ FIG. 20 ]
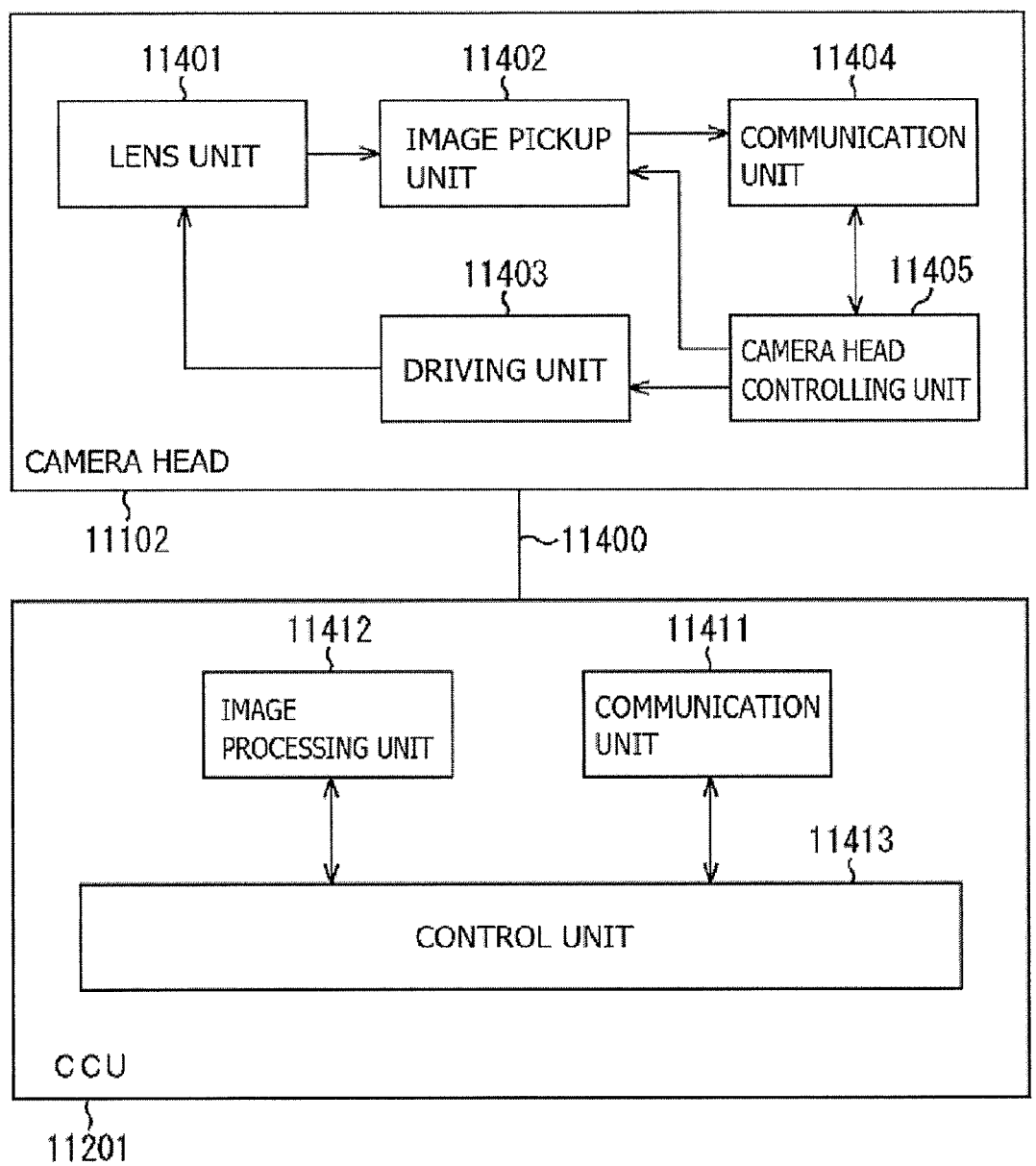

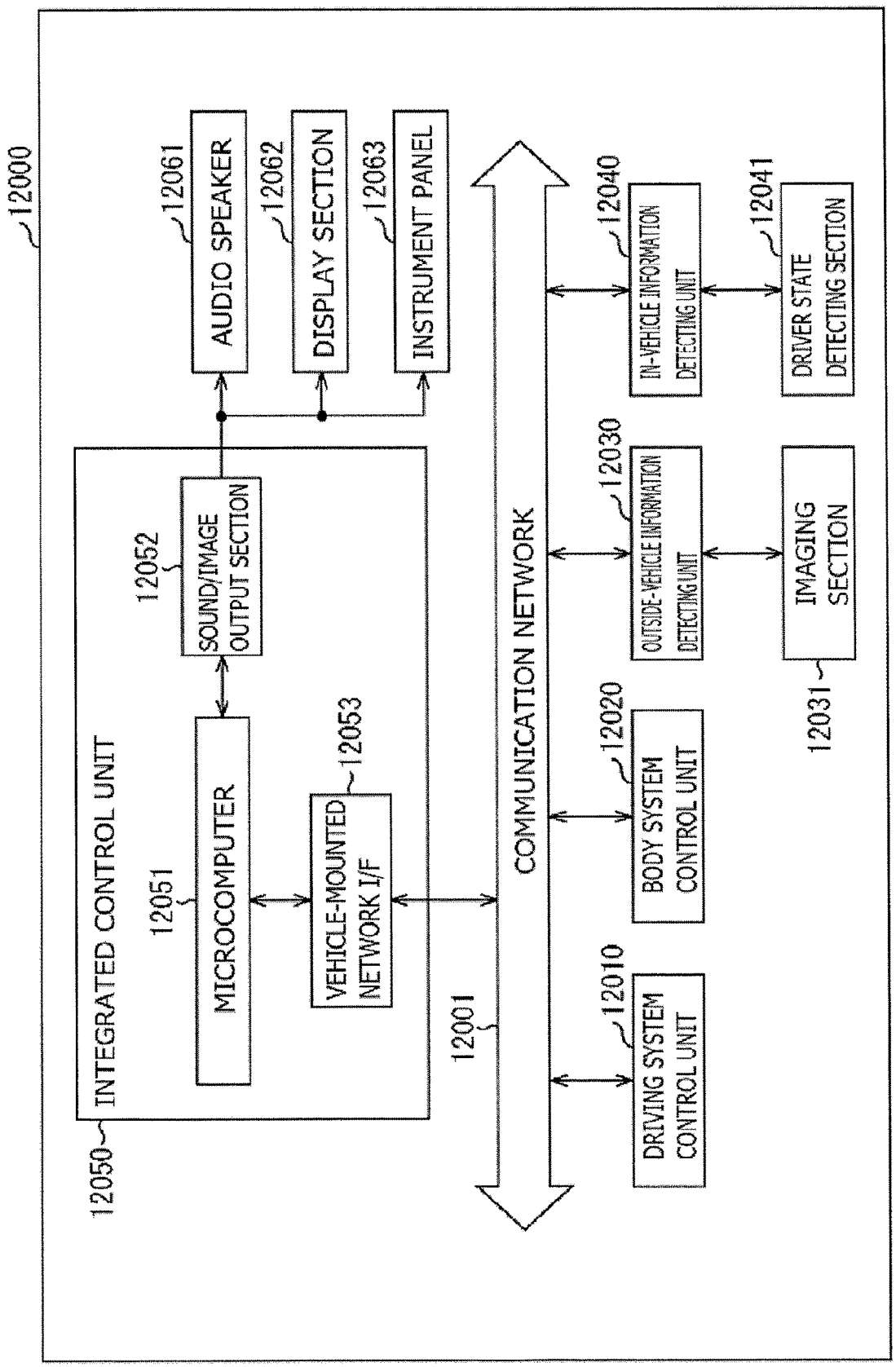
[FIG. 21]

[ FIG. 22 ]
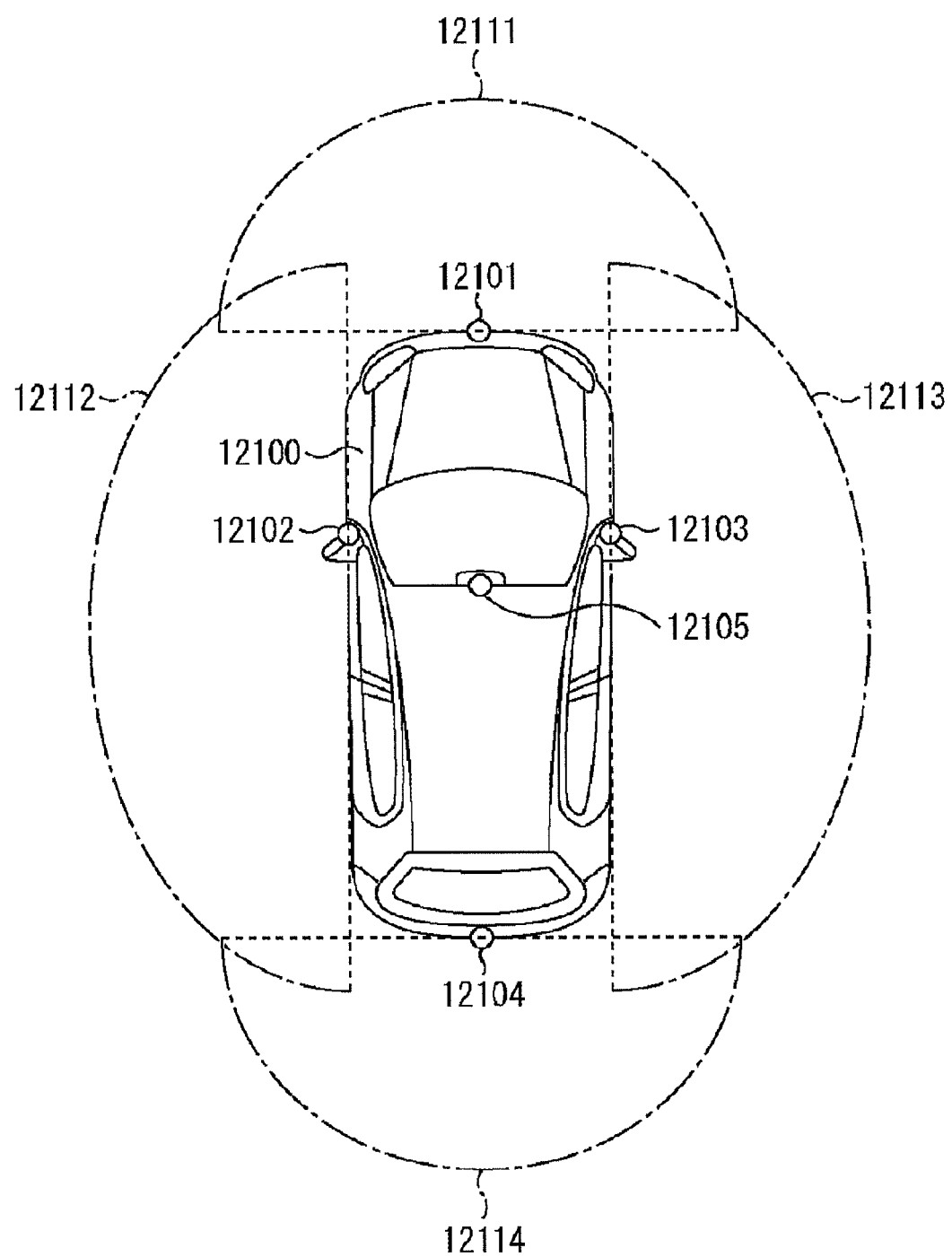

[ FIG. 23 ]
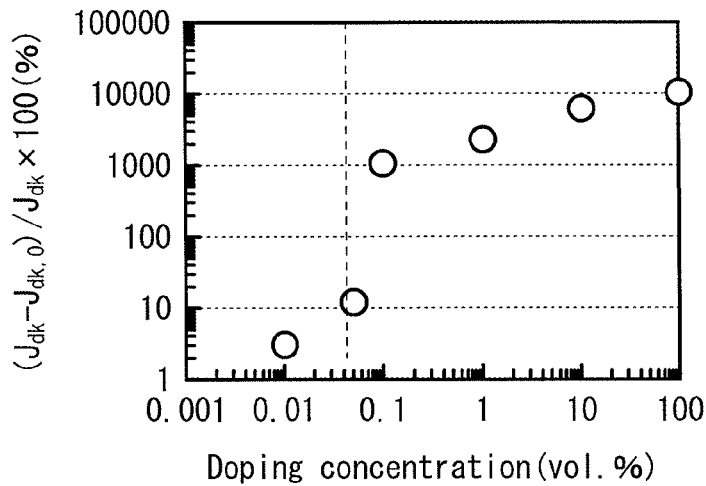
[ FIG. 24 ]
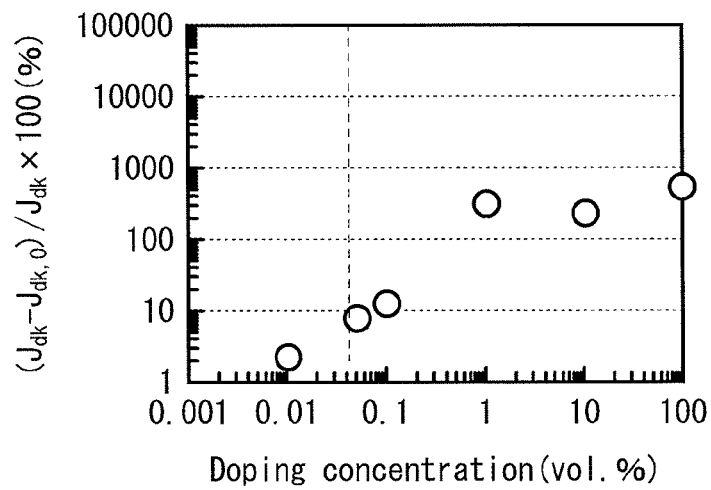
[ FIG. 25 ]
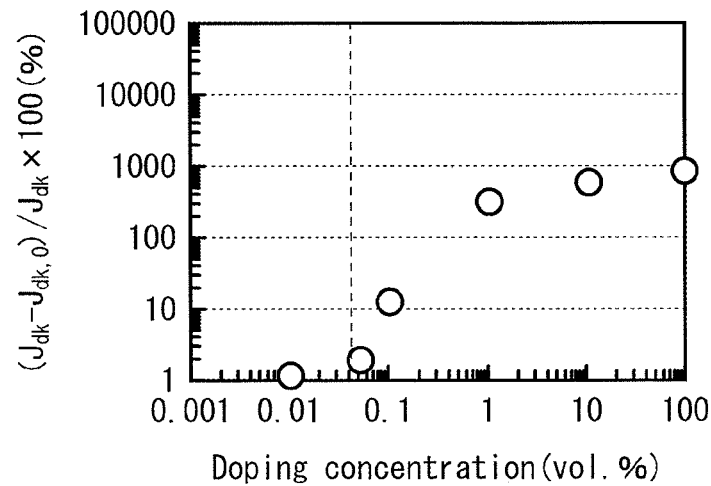

[ FIG. 26 ]
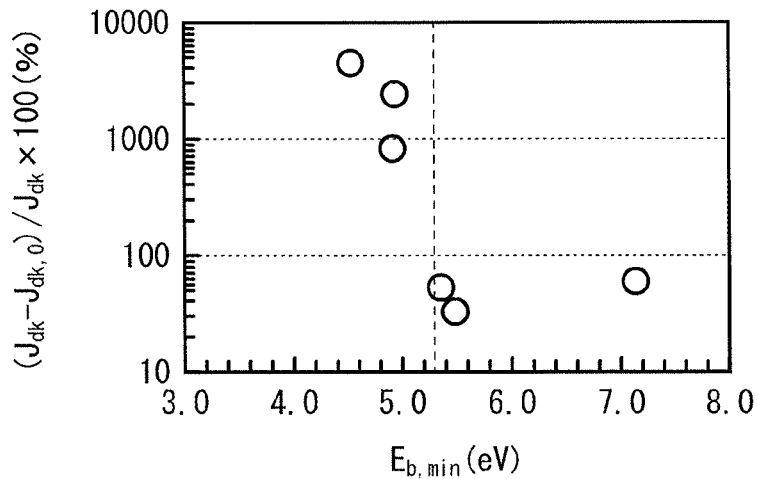
[ FIG. 27 ]
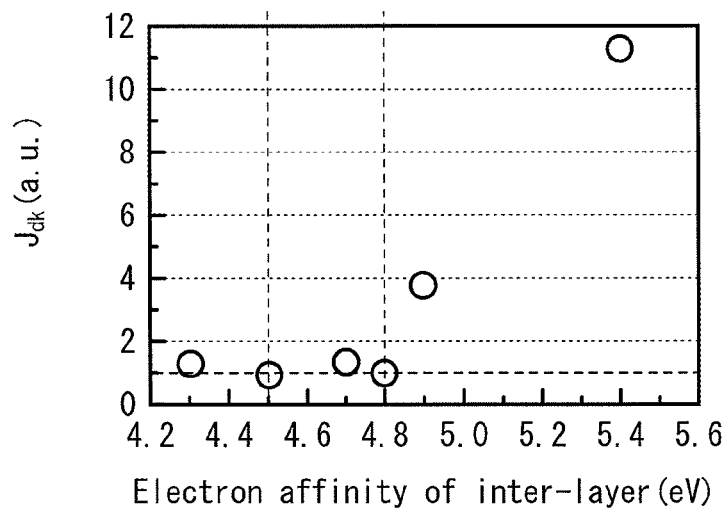
[ FIG. 28 ]
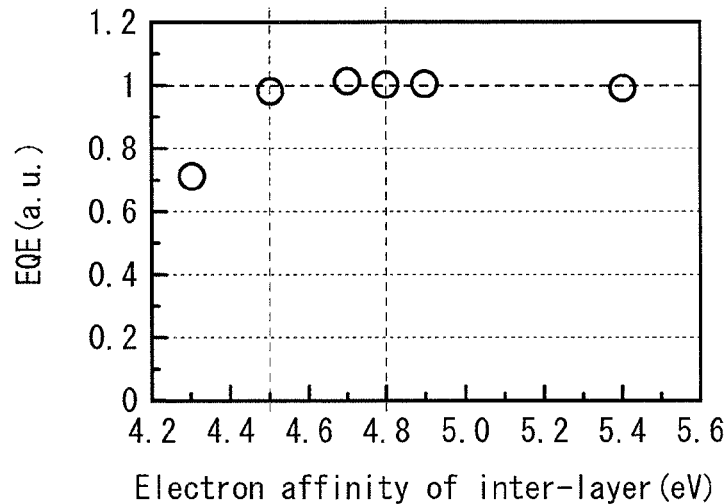

[ FIG. 29 ]
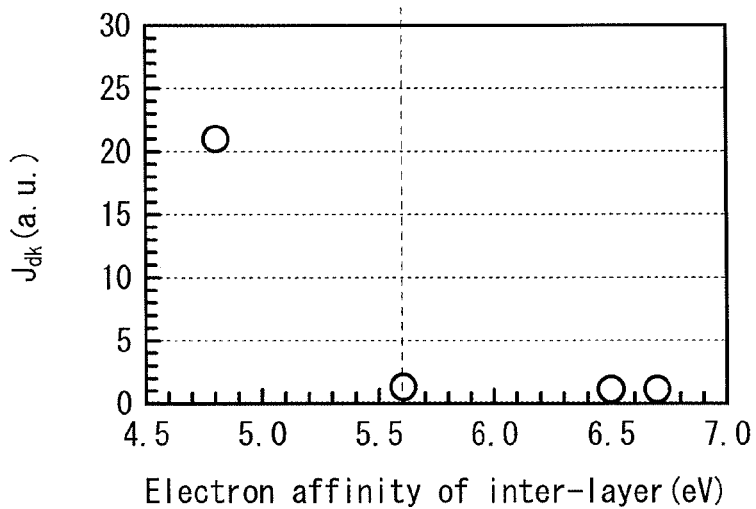
[ FIG. 30 ]
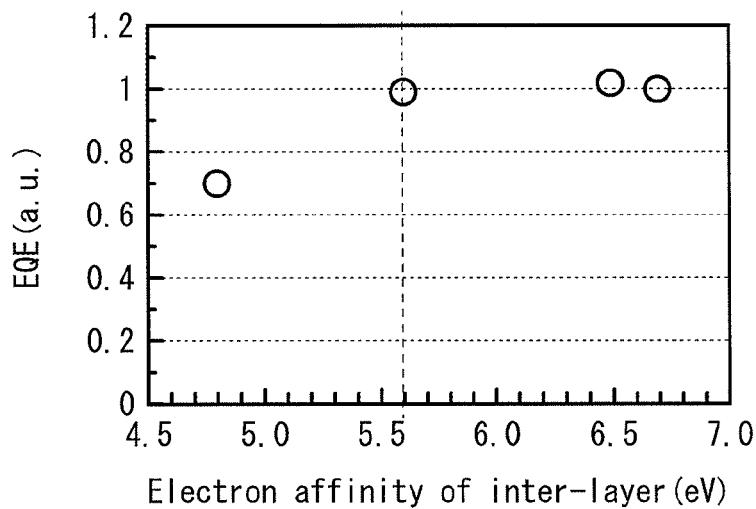
[ FIG. 31 ]
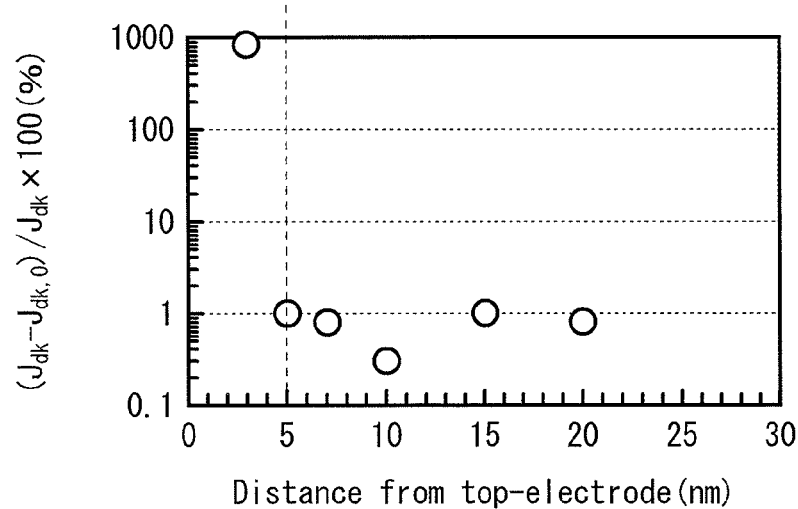

SOLID-STATE IMAGING ELEMENT AND SOLID-STATE IMAGING APPARATUS

CROSS REFERENCE TO RELATED APPLICATIONS

This application is a national stage application under 35 U.S.C. 371 and claims the benefit of PCT Application No. PCT/JP2017/026243 having an international filing date of 20 Jul. 2017, which designated the United States, which PCT application claimed the benefit of Japanese Patent Application Nos. 2016-142154 filed 20 Jul. 2016 and 2016-155728 filed 8 Aug. 2016, the entire disclosures of each of which are incorporated herein by reference.

TECHNICAL FIELD

The present disclosure relates to a solid-state imaging element including a photoelectric conversion layer that uses an organic semiconductor material, and a solid-state imaging apparatus including the solid-state imaging element.

BACKGROUND ART

In a solid-state imaging element including an organic semiconductor material, in general, a photoelectric conversion layer is formed by stacking or mixing of a p-type organic semiconductor and an n-type organic semiconductor. This allows for efficient charge generation and charge transport.

In addition, for example, PTL 1 discloses an organic photoelectric conversion element including a carrier blocking layer (an electron blocking layer and a hole blocking layer) and a charge transport layer (an electron transport auxiliary layer and a hole transport auxiliary layer), respectively, between a negative electrode and an organic photoelectric conversion film and between a positive electrode and the organic photoelectric conversion film. The negative electrode and the positive electrode are opposed to each other with the organic photoelectric conversion film interposed therebetween. This organic photoelectric conversion element attempts to further enhance charge extraction efficiency by provision of the charge blocking layer and the charge transport layer.

CITATION LIST

Patent Literature

PTL 1: Japanese Unexamined Patent Application Publication No. 2014-22525

SUMMARY OF DIE INVENTION

Incidentally, a solid-state imaging element is requested to enhance electric characteristics. In addition, the solid-state imaging element is requested to have excellent responsivity.

It is desirable to provide a solid-state imaging element and a solid-state imaging apparatus that make it possible to enhance the electric characteristics. In addition, it is desirable to provide a solid-state imaging element and a solid-state imaging apparatus that make it possible to enhance the responsivity.

A first solid-state imaging element according to an embodiment of the present disclosure includes: a bottom-electrode; a top-electrode opposed to the bottom-electrode; a photoelectric conversion layer provided between the bottom-electrode and the top-electrode and including a first organic semiconductor material; and an upper inter-layer provided between the top-electrode and the photoelectric conversion layer, and including a second organic semiconductor material having a halogen atom in a molecule at a concentration in a range from 0 volume % or more to less than 0.05 volume %.

A first solid-state imaging apparatus according to an embodiment of the present disclosure includes one or a plurality of first solid-state imaging elements according to the foregoing embodiment of the present disclosure, for each of a plurality of pixels.

In the first solid-state imaging element and the first solid-state imaging apparatus according to the respective embodiments of the present disclosure, the upper inter-layer including the second organic semiconductor material having a halogen atom in a molecule at a concentration in a range from 0 volume % or more to less than 0.05 volume % is provided between the top-electrode and the photoelectric conversion layer including the first organic semiconductor material. This makes it possible to suppress modification of organic materials included in the top-electrode and the solid-state imaging element during film formation.

A second solid-state imaging element according to an embodiment of the present disclosure includes: a bottom-electrode; a top-electrode opposed to the bottom-electrode; a photoelectric conversion layer provided between the bottom-electrode and the top-electrode and including an organic semiconductor material that has one or two or more halogen atoms in a molecule and in which binding energy of a halogen atom having smallest binding energy in the molecule is 5.4 eV or higher; and an upper inter-layer provided between the top-electrode and the photoelectric conversion layer.

A second solid-state imaging apparatus according to an embodiment of the present disclosure includes one or a plurality of second solid-state imaging elements according to the foregoing embodiment of the present disclosure for each of a plurality of pixels.

In the second solid-state imaging element and the second solid-state imaging apparatus according to the respective embodiments of the present disclosure, the upper inter-layer is provided between the top-electrode and the photoelectric conversion layer, and the organic semiconductor material that has one or two or more halogen atoms in a molecule and in which binding energy of a halogen atom having smallest binding energy in the molecule is 5.4 eV or higher is used as a material of the photoelectric conversion layer. This makes it possible to suppress the modification of organic materials included in the top-electrode and the solid-state imaging element during film formation.

A third solid-state imaging element according to an embodiment of the present disclosure includes: a bottom-electrode; a top-electrode opposed to the bottom-electrode; a photoelectric conversion layer provided between the bottom-electrode and the top-electrode and including an organic semiconductor material having a halogen atom in a molecule; and an organic semiconductor layer provided between the top-electrode and the photoelectric conversion layer, in which a distance between the top-electrode and the photoelectric conversion layer is in a range from 5 nm to 20 nm both inclusive.

A third solid-state imaging apparatus according to an embodiment of the present disclosure includes one or a plurality of third solid-state imaging elements according to the foregoing embodiment of the present disclosure for each of a plurality of pixels.

In the third solid-state imaging element and the third solid-state imaging apparatus according to the respective embodiments of the present disclosure, the organic semiconductor material is provided between the top-electrode and the photoelectric conversion layer, and the distance between the top-electrode and the photoelectric conversion layer is in the range from 5 nm to 20 nm both inclusive. This makes it possible to suppress the modification of the lop-electrode during film formation.

A fourth solid-state imaging element according to an embodiment of the present disclosure includes, a first electrode; a second electrode opposed to the first electrode; and a photoelectric conversion layer provided between the first electrode and the second electrode, in which the photoelectric conversion layer includes an exciton generation layer including a dye material and a first semiconductor material, and an exciton disassociation layer including a second semiconductor material.

A fourth solid-state imaging apparatus according to the embodiment of the present disclosure includes one or a plurality of fourth solid-state imaging elements according to the foregoing embodiment of the present disclosure, for each of a plurality of pixels.

In the fourth solid-state imaging element and the fourth solid-state imaging apparatus according to the respective embodiments of the present disclosure, the photoelectric conversion layer includes the exciton generation layer including the dye material and the first semiconductor material, and the exciton disassociation layer including the second semiconductor material. This makes it possible to separate a light absorbing field (an exciton generation layer) and a charge generating field (an exciton disassociation layer).

According to the first solid-state imaging element and the first solid-state imaging apparatus according to the respective embodiments of the present disclosure, the upper inter-layer including the second organic semiconductor material having a halogen atom in a molecule at a concentration in a range from 0 volume % or more to less than 0.05 volume % is provided between the top-electrode and the photoelectric conversion layer including the first organic semiconductor material. This suppresses the modification during the film formation of the organic materials included in the top-electrode and the solid-state imaging element, thus making it possible to enhance electric characteristics.

According to the second solid-state imaging element and the second solid-state imaging apparatus according to the respective embodiments of the present disclosure, the upper inter-layer is provided between the top-electrode and the photoelectric conversion layer, and the organic semiconductor material that has one or two or more halogen atoms in a molecule and in which binding energy of a halogen atom having smallest binding energy in the molecule is 5.4 eV or higher is used as the material of the photoelectric conversion layer. This suppresses the modification during the film formation of the organic materials included in the top-electrode and the solid-state imaging element, thus making it possible to enhance electric characteristics.

According to the third solid-state imaging element and the third solid-state imaging apparatus according to the respective embodiments of the present disclosure, the organic semiconductor material is provided between the top-electrode and the photoelectric conversion layer to cause the distance between the top-electrode and the photoelectric conversion layer to be in the range from 5 nm to 20 nm. This suppresses the modification of the top-electrode during the film formation, thus making it possible to enhance electric characteristics.

According to the fourth solid-state imaging element and the fourth solid-state imaging apparatus according to the respective embodiments of the present disclosure, provision of the exciton generation layer including the dye material and the first semiconductor material and the exciton disassociation layer including the second semiconductor material separates the light absorbing field and the charge generating field. This makes it possible to enhance electric characteristics.

It is to be noted that effects described here are not necessarily limited and any of effects described in the present disclosure may be included.

BRIEF DESCRIPTION OF DRAWINGS

FIG. 1 is a schematic view of a cross-sectional configuration of an organic photoelectric converter according to a first embodiment of the present disclosure.

FIG. 2 is a cross-sectional view of a schematic configuration of a solid-state imaging element according to the first embodiment of the present disclosure.

FIG. 3A is a diagram illustrating an example of an energy level of the organic photoelectric converter illustrated in FIG. 1.

FIG. 3B is a diagram illustrating another example of the energy level of the organic photoelectric converter illustrated in FIG. 1.

FIG. 4 is a schematic plan view of a configuration of a pixel of a solid-state imaging apparatus illustrated in FIG. 2.

FIG. 5 is a cross-sectional view for description of a method of manufacturing the solid-state imaging element illustrated in FIG. 2.

FIG. 6 is a cross-sectional view of a process following FIG. 5.

FIG. 7 is cross-sectional view of a process following FIG. 6.

FIG. 8 is a cross-sectional view of a process following FIG. 7.

FIG. 9 is a schematic view of a cross-sectional configuration of an organic photoelectric converter according to a second embodiment of the present disclosure.

FIG. 10 is a schematic view of a cross-sectional configuration of an organic photoelectric converter according to a third embodiment of the present disclosure.

FIG. 11 is a schematic view of a cross-sectional configuration of an organic photoelectric converter according to a fourth embodiment of the present disclosure.

FIG. 12A is a diagram illustrating an example of an energy level of respective layers that configure the photoelectric conversion layer illustrated in FIG. 11.

FIG. 12B is a diagram illustrating another example of the energy level of the respective layers that configure the photoelectric conversion layer illustrated in FIG. 11.

FIG. 13A is a diagram of another example of the energy level of the respective layers that configure the photoelectric conversion layer illustrated in FIG. 11.

FIG. 13B is a diagram illustrating another example of the energy level of the respective layers that configure the photoelectric conversion layer illustrated in FIG. 11.

FIG. 14 is a cross-sectional view of an example of a schematic configuration of a solid-state imaging element (an organic photoelectric converter) according to a fifth embodiment of the present disclosure.

FIG. 15 is a cross-sectional view of an example of a schematic configuration of a solid-state imaging element (an organic photoelectric converter) according to a sixth embodiment of the present disclosure.

FIG. 16 is a functional block diagram illustrating a solid-state imaging apparatus that uses, as a pixel, the solid-state imaging element illustrated in FIG. 2.

FIG. 17 is a block diagram illustrating a schematic configuration of an electronic apparatus that uses the solid-state imaging apparatus illustrated in FIG. 16.

FIG. 18 is a block diagram depicting an example of a schematic configuration of an in-vivo information acquisition system.

FIG. 19 is a View depicting an example of a schematic configuration of an endoscopic surgery system.

FIG. 20 is a block diagram depicting an example of a functional configuration of a camera head and a camera control unit (CCU).

FIG. 21 is a block diagram depicting an example of schematic configuration of a vehicle control system.

FIG. 22 is a diagram of assistance in explaining an example of an installation position of an imaging section.

FIG. 23 is a characteristic diagram illustrating a relation of a doping concentration and a rate of increasing a dark current from before to after formation of a protective layer in Experiment 1.

FIG. 24 is a characteristic diagram illustrating the relation of the doping concentration and the rate of increasing the dark current from before to after the formation of the protective layer in Experiment 2.

FIG. 25 is a characteristic diagram illustrating the relation of the doping concentration and the rate of increasing the dark current from before to after the formation of the protective layer in Experiment 3.

FIG. 26 is a characteristic diagram illustrating a relation of minimum binding energy and the rate of increasing the dark current from before to after the formation of the protective layer.

FIG. 27 is a characteristic diagram illustrating a relation of electron affinity and a dark current of an upper inter-layer in experimental examples 28 to 33.

FIG. 28 is a characteristic diagram illustrating a relation of the electron affinity and quantum efficiency of the upper inter-layer in the experimental examples 28 to 33.

FIG. 29 is a characteristic diagram illustrating the relation of the electron affinity aid the dark current of the upper inter-layer in experimental examples 34 to 37.

FIG. 30 is a characteristic diagram illustrating the relation of the electron affinity and the quantum efficiency of the upper inter-layer in the experimental examples 34 to 37.

FIG. 31 is a characteristic diagram illustrating a relation of a distance between a photoelectric conversion layer and a top-electrode and a rate $(j_{dk}-j_{dk,\,0})/j_{dk,\,0}$ of increasing the dark current from before to after the formation of the protective layer.

MODES FOR CARRYING OUT THE INVENTION

In the following, some embodiments of the disclosure are described in detail with reference to the drawings. The embodiments described below each illustrate a specific example of the present disclosure, and the present disclosure is not limited to the following embodiments. Moreover, the present disclosure is not limited to positions, dimensions, dimension ratios, and other factors of respective components illustrated in the drawings. It is to be noted that description is given in the following order.

1. First Embodiment (First example in which an upper inter-layer is provided between a top-electrode and a photoelectric conversion layer)
1-1. Configuration of Solid-state Imaging Element
1-2. Method of Manufacturing Solid-state Imaging Element
1-3. Workings and Effects
2 Second Embodiment (Second example in which the upper inter-layer is provided between the top-electrode and the photoelectric conversion layer)
3. Third Embodiment (Third example in which the upper inter-layer is provided between the top-electrode and the photoelectric conversion layer)
4. Fourth Embodiment (Example having a photoelectric conversion layer including an exciton generation layer and an exciton disassociation layer)
4-1. Configuration of Organic Photoelectric Converter
4-2. Workings and Effects
5. Fifth Embodiment (Example in which an inter-layer is provided between the exciton generation layer and the exciton disassociation layer)
6. Sixth Embodiment (Example in which another inter-layer is further provided between the exciton generation layer and the exciton disassociation layer)
7. Application Examples
8. Examples

1. FIRST EMBODIMENT

FIG. 1 schematically illustrates a cross-sectional configuration of an organic photoelectric converter 20 included in a solid-state imaging element (a solid-state imaging element 10) according to a first embodiment of the present disclosure. FIG. 2 illustrates a cross-sectional configuration of the solid-state imaging element 10 including the organic photoelectronic converter 20 illustrated in FIG. 1. The solid-state imaging element 10 configures one pixel (a unit pixel P) in a solid-state imaging apparatus (a solid-state imaging apparatus 1: see FIG. 14) such as a CMOS image sensor used in an electronic apparatus such as a digital still camera and a video camera, for example.

(1-1. Configuration of Solid-State Imaging Element)

The solid-state imaging element 10 is of a so-called longitudinal direction spectral type in which, for example, at least an organic photoelectric converter 20A and two inorganic photoelectric cons 32B and 32R are stacked in a longitudinal direction. The organic photoelectric converter 20A is provided on a side on which a first surface (back side) 30A is located of a semiconductor substrate 30. The inorganic photoelectric converters 328 and 32R are formed to be embedded in the semiconductor substrate 30, and are stacked in a thickness direction of the semiconductor substrate 30. The or photoelectric converter 20A has a configuration in which a lower inter-layer 22 is provided between a bottom-electrode 21 and a photoelectric conversion layer 23A, and an upper inter-layer 24 is provided between the photoelectric conversion layer 23A and a top-electrode 25.

The organic photoelectric converter 20A and the inorganic photoelectric converters 32B and 32R selectively detect light of mutually different wavelength ranges to perform photoelectric conversions. For example, the organic photoelectric converter 20A acquires a green (G) color signal. The inorganic photoelectric converters 32B and 32R respectively acquire a blue (B) color signal and a red (R) color signal by a difference in absorption coefficients. This allows the solid-state imaging element 10 to acquire a plurality of types of the color signals in one pixel without using a color filter.

It is to be noted that the present embodiment, description is given of a case where electrons of electron-hole pairs generated by photoelectric conversion in the inorganic photoelectric converters 32B and 32R are read as signal charges (in a case where an n-type semiconductor region serves as a photoelectric conversion layer). Moreover, in the drawings "+ (plus)." attached to "p" or "n" indicates that p-type or n-type impurity concentration is high, and "++" indicates that p-type or n-type impurity concentration is higher than that in a case of "+".

For example, floating diffusions (floating diffusion layers) FD1, FD2, and FD3, a vertical type transistor (transfer transistor) Tr1, a transfer transistor Tr2, an amplifier transistor (modulation element) AMP, a reset transistor RST, and multilayer wiring 40 are provided on a second surface (front side) 30B of the semiconductor substrate 30. The multilayer wiring 40 has a configuration in which wiring layers 41, 42, and 43 are stacked in an insulating layer 44.

It is to be noted that in the drawings, the side on which the first surface 30A is located of the semiconductor substrate 30 is represented as a light entering side S1 and a side on which the second surface 30B is located of the semiconductor substrate 30 is represented as a wiring layer side S2.

The organic photoelectric converter 20A has a configuration in which, as described above, the bottom-electrode 21, the lower in 22, the photoelectric conversion layer 23A, the upper inter-layer 24, and the top-electrode 25 are stacked in this order from the side on which the first surface 30A is located of the semiconductor substrate 30. In the present embodiment, the top-electrode 25 is separately formed for each of the solid-state imagine elements 10, for example. The bottom-electrode 21, the lower inter-layer 22, the photoelectric conversion layer 23A and the upper inter-layer 24 are provided as a continuous layer common to, a plurality of solid-state imaging elements 10. For example, a layer having fixed charges (a fixed charge layer) 26, a dielectric layer 27 having an insulating property, and an inter-layer insulating layer 28 are provided between the first surface 30A of the semiconductor substrate 30 and the bottom-electrode 21. A protective layer 29 is provided on the top-electrode 25. Optical members such as a planarization layer and an on-chip lens (both not illustrated) are disposed above the protective layer 29.

A through electrode 34 is provided between the first surface 30A and the second surface 30B of the semiconductor substrate 30. The organic photoelectric converter 20A is coupled to a gate Gamp of the amplifier transistor AMP and the floating diffusion FD3 via the through electrode 34. This allows the solid-state imaging element 10 to well transfer the charges generated in the organic photoelectric converter 20A on the side on which the first surface 30A is located of the semiconductor substrate 30 to the side on which the second surface 30B is located of the semiconductor substrate 30 via the through electrode 34, thereby enhancing characteristics.

The through electrode 34 is provided in each of the organic photoelectric conveners 20A in each of the solid-state imaging elements 10, for example. The through electrode 34 has a function as a connector between the organic photoelectric converter 20A and both the gate Gamp of the amplifier transistor AMP and the floating diffusion FD3, and serves as a transmission path of the charges (herein, electrons) generated in the organic photoelectric converter 20A. A lower end of the through electrode 34 is coupled to a connection unit 41A in the wiring layer 41 of the multilayer wiring 40 via a first lower contact 35, for example. The connection unit 41A and the gate Gamp of the amplifier transistor AMP are coupled via a second lower contact 45. The connection unit 41A and the floating diffusion FD3 are coupled by a third lower contact 46. A top edge of the through electrode 34 is coupled to the top-electrode 25 via an upper contact 36, for example.

It is preferable that a reset gate Grst of the reset transistor RST be disposed next to the floating diffusion FD3, as illustrated in FIG. 2. This makes it possible to reset the charges accumulated in the floating diffusion FD3 by the reset transistor RST.

The through electrode 34 penetrates the semiconductor substrate 30 and is separated from the semiconductor substrate 30 by a separation groove 50, for example. It is preferable that, for example, the through electrode 34 include the same semiconductor as the semiconductor substrate 30, for example, silicon (Si), and have a resistance value reduced by injection of the n-type or the p-type impurity (indicated by pi in FIG. 2, for example). It is also preferable that a high-concentration impurity region (indicated by p++ in FIG. 2, for example) be provided in an upper end section a lower end section of the through electrode 34 and that connection resistance with the upper contact 36 and the connection resistance with the first lower contact 35 be further reduced. The through electrode 34 may include metal or a conductive material. Use of the metal or the conductive material makes it possible to further reduce the resistance value of the through electrode 34 and further reduce the connection resistance of the through electrode 34 with the first lower contact 35, the second lower contact 45, and the third lower contact 46. As the metal or the conductive material included in the through electrode 34, aluminum (Al), tungsten (W), titanium (Ti), cobalt (Co), hafnium (Hf), tantalum (Ta), etc. are adopted.

As illustrated in FIG. 2, an outer surface 51, an inner surface 52, and a bottom surface 53 of the separation groove 50 are covered by the dielectric layer 27 having an insulating property, for example. The dielectric layer 27 has an outer dielectric layer 27A covering the outer surface 51 of the separation groove 50 and an inner dielectric layer 27B covering the inner surface 52 of the separation groove 50. It is preferable that a cavity 54 be provided between the outer dielectric layer 27A and the inner dielectric layer 27B. That is, the separation groove 50 is circular or annular, and the cavity 54 is circular or annular, forming a concentric circle with the separation groove 50. This reduces electrostatic capacitance generated between the through electrode 34 and the semiconductor substrate 30, thus making it possible to improve the conversion efficiency and suppress a delay (residual image).

In addition, it is preferable that an impurity region (indicated by p+ in FIG. 2) of a same conductivity type (n-type p-type) as the through electrode 34 be provided in the semiconductor substrate 30 on the outer surface 51 of the separation groove 50. Furthermore, it is preferable that the fixed charge layer 26 be provided on the outer surface 51, the inner surface 52, and the bottom surface 53 of the separation, groove 50, and on the first surface 3M of the semiconductor substrate 30. Specifically, it is preferable to provide a p-type impurity region (indicated by p+ in FIG. 2) in the semiconductor substrate 30 on the outer surface 51 of the separation groove 50, and to provide a film having negative fixed charges as the fixed charge layer 26. This allows for reduction in a dark current.

In the solid-state imaging element 10 of the present embodiment, light entering, the organic photoelectric converter 20A from a side on which the top-electrode 25 is located is absorbed by a dye material included in the photoelectric conversion layer 23A. In addition, the photoelectric conversion layer 23A includes either a material serving as an electron donor or a material serving as an electron acceptor for the dye material. Excitons generated by light absorption of the dye material are thereby disassociated to generate charges at an interface between the dye material and the electron donor or at an interface between the dye material and the electron acceptor. The charges (electrons and holes) generated at the interface are each carried to a corresponding electrode by diffusion resulting from a difference in concentration of the electrons, an internal electric field resulting from a difference in work function between the bottom-electrode 21 and the top-electrode 25, or application of a voltage between the bottom-electrode 21 and the top-electrode 25, and are detected as a photocurrent. It is also possible to control transport directions of the electrons and the holes by control of an internal electric field generated between the bottom-electrode 21 and the top-electrode 25.

In the following, description is given of the configurations, materials, etc. of respective components.

The organic photoelectric converter 20A is a photoelectric conversion element that absorbs green light corresponding to a portion or the entirety of a selective wavelength range (for example, 495 nm to 570 nm) to generate the electron-hole pairs.

The bottom-electrode 21 is directly opposed to light receiving surfaces of the inorganic photoelectric converters 32B and 32R formed in the semiconductor substrate 30, and is provided in regions covering the light receiving surfaces. The bottom-electrode 21 is formed with use of a conductive material having optical transparency (a transparent conductive material), and includes ITO (indium tin oxide), for example. However, in addition to ITO, a tin oxide ($SnO_2$)-based material to which a dopant is added or a zinc oxide-based material prepared through adding a dopant to zinc oxide (ZnO) may be used as a constituent material of the bottom-electrode 21. Examples of the zinc oxide-based material include aluminum zinc oxide (AZO) to which aluminum (Al) is added as a dopant, gallium zinc oxide (GZO) to which gallium (Ga) is added, and indium zinc oxide (IZO) to which indium (In) is added. In addition to these materials, indium-tungsten oxide (IWO), CuI, $InSbO_4$, ZnMgO, $CuInO_2$, $MgIn_2O_4$, CdO, $ZnSnO_3$, etc. may also be used. In the solid-state imaging apparatus 1 that uses the solid-state imaging element 10 as one pixel, the bottom-electrode 21 may be separated for each pixel or may be formed as a common electrode for respective pixels.

The lower inter-layer 22 functions as a charge injection blocking layer that suppresses injection of the charges from the bottom-electrode 21. For example, in a case where the bottom-electrode 21 is used as an anode, the lower inter-layer 22 functions as an electron injection blocking layer that suppresses injection of electrons front the bottom-electrode 21. In this case, examples of a material that forms the lower inter-layer 22 include, a phenanthroline-based compound, an aluminum quinoline-based compound, an oxadiazol-based compound, and a silole-based compound. It is preferable that a film thickness in a stacking direction (hereinafter, simply referred to as a thickness) of the lower inter-layer 22 be, for example, in a range from 5 nm to 100 nm both inclusive.

In a case where the bottom-electrode 21 is used as a cathode, the lower inter-layer 22 functions as a hole injection blocking layer that suppresses injection of holes front the bottom-electrode 21. In this case, examples of the material included in the lower inter-layer 22 include a naphthalene diimide-based material and a material including pyridine, pyrimidine, or triazine, and more specific examples thereof include B3PyMPM (bis-4,6-(3,5-di-3-pyridylphenyl)-2-methylpyrimi-dine), etc. In addition, the material of the lower inter-layer 22 is not limited to an organic semiconductor, and the lower inter-layer 22 may be formed with use of an oxide semiconductor such as ZnO, $TiO_2$, and InGaZnO. It is preferable that the lower inter-layer 22 have a thickness in a range from 5 nm to 200 nm both inclusive, for example.

The photoelectric conversion layer 23A converts optical energy into electric energy. The photoelectric conversion layer 23A is formed with use of the dye material absorbing light, and the electron acceptor or the election donor or both with respect to the dye material. The photoelectric conversion layer 23A is provided by mixing of the dye material and the electron acceptor, mixing of the dye material and the electron donor, or mixing of the dye material, the electron acceptor, and the electron donor. The photoelectric conversion layer 23A has a so-called bulk hetero structure in a layer in which bonded surfaces of the dye material and the electron acceptor or bonded surfaces of the dye material and the electron donor, or both are formed. The photoelectric conversion layer 23A provides a field where excitons generated upon absorption of light are dissociated into electrons and holes. Specifically, the excitons are dissociated into the electrons and the holes at the interface between the dye material and the electron donor or the interface between the dye material and the electron acceptor, or both.

Examples of materials included in the photoelectronic conversion layer 23A include quinacridone, boron subphthalocyanine chloride, boronated boron subphthalocyanine pentacene, benzothieno-benzothiphene, fullerene, and derivatives thereof. The photoelectric conversion layer 23A includes a combination of two or more kinds of the foregoing organic semiconductor materials. The foregoing organic semiconductor materials function as a p-type semiconductor or an n-type semiconductor, depending on the combination.

It is to be noted that the organic semiconductor material (a first organic semiconductor material) included in the photoelectric conversion layer 23A is not limited, in particular. Besides the organic semiconductor materials listed above, for example, any one kind of naphthalene, anthracene, phenantherene, tetracene, pyrene, perylene, and fluoranthene, and derivatives thereof is preferably used. Alternatively, a polymer such as phenylenevinylene, fluorene, carbazole, indole, pyrene, pyrrole, picoline, thiophene, acetylene, diacetylene or a derivative thereof may be used. Additionally, it is possible to preferably use a metal complex dye, a cyanine-based dye, a merocyanine-based dye, a phenylxathene-based dye, a triphenylmethane-based dye, a rhodacyanine-based dye, a xanthene-based dye, a macrocyclic azaannulene-based dye, an azulene-based dye, naphthaquinone, an anthraquinone-based dye, a chain compound in which a condensed polycyclic aromatic group such as anthracene and pyrene and an aromatic ring or a heterocyclic compound are condensed, a cyanine-like dye bonded by two nitrogen-containing hetero rings such as quinoline, benzothiazole, and benzoxazole that have a squarylium group and croconic methine group as a bonded chain, or by ae squarylium group or a croconic methine group, etc. It is to be noted that the foregoing metal complex dye is preferably, but not limited to, a dithiol metal complex-based dye, a metallophthalocyanine dye, a metalloporphyrine dye, or a ruthenium complex dye. The photoelectric conversion layer 23A preferably has a thickness in a range from 50 nm to 500 nm both inclusive, for example.

The upper inter-layer 24 functions as a charge injection blocking layer that suppresses injection of charges from the lop-electrode 25. As a material forming the upper inter-layer 24, an organic semiconductor material having no halogen atom in a molecule is preferably used. However, in a case where an organic semiconductor material (a second organic semiconductor material) having a halogen atom in a molecule is used, it is preferable that a concentration of the second organic semiconductor material in the upper inter-layer 24 be less than 0.05 volume %.

For example, the upper inter-layer 24 functions as a hole injection blocking layer that suppresses injection of holes from the top-electrode 25 in a case where the lop-electrode 25 is used as a cathode electrode. In this case, examples of a material that forms the upper inter-layer 24 include a naphthalene diimide-based material and a material including pyridine, pyrimidine, or triaxine, and more specific examples thereof include B3PyMPM (bis-4,6-(3,5-di-3-pyridylphenyl)-2-methylpyrimi-dine), etc. It is preferable that the upper inter-layer 24 have a thickness in a range from 5 nm to 100 nm both inclusive, for example.

In addition, the upper inter-layer 24 may be used for the purpose of controlling an effective work function of the top-electrode, for example. In this case, examples of a material that forms the upper inter-layer 24 include molybdenum oxide ($MoO_2$, $MoO_3$), tungsten oxide ($WO_3$), and HAT-CN (1,4,5,8,9,11-Hexaazatriphenylenehexacarbonitrile), etc. Formation of the upper inter-layer 24 using the foregoing material makes it possible to control a charge readout direction to cause the top-electrode 25 to function as an anode.

It is to be noted that in a case where the top-electrode 25 is used as the anode, an electron injection blocking layer may be provided between the upper inter-layer 24 and the photoelectric conversion layer 23A. Examples of a material of the electron injection blocking layer include a phenanthroline-based compound, an aluminum quinoline-based compound, an oxadiazole-based compound, a silole-based compound, etc. It is preferable that the electron injection blocking layer have a thickness in a range from 5 nm to 100 nm both inclusive, for example.

Any layer other than the lower inter-layer 22, the photoelectric conversion layer 23A, and the upper inter-layer 24 may be provided in the organic photoelectric converter 20A. As the other layers, to enhance carrier injection blocking performance, for example, another carrier injection blocking layer may be provided between the lower inter-layer 22 and the photoelectric conversion layer 23A or between the upper inter-layer 24 and the photoelectric conversion layer 23A. The foregoing electron injection blocking layer is a specific example of the carrier injection blocking layer.

The lop-electrode 25 is formed with use of a conductive material (a transparent conductive material) having optical transparency similar to the bottom-electrode 21. Specific examples of the conductive material includes ITO (indium tin oxide), a tin oxide ($SnO_2$)-based material to which a dopant is added or a zinc oxide-based material to which a dopant is added. Examples of the zinc oxide-based material include aluminum zinc oxide (AZO) to which aluminum (Al) is added as a dopant, gallium zinc oxide (GZO) to which gallium (Ga) is added, and indium zinc oxide (IZO) to which indium (In) is added. In addition to these materials, indium-tungsten oxide (IWO), CuI, $InSbO_4$, ZnMgO, $CuInO_2$, $MgIn_2O_4$, CdO, $ZnSnO_3$, etc. may also be used. It is preferable that the top-electrode 25 have a thickness in a range from 10 nm to 200 nm both inclusive, for example.

It is to be noted that although a plurality of materials are listed as the materials of the respective layers that configure the organic photoelectric converter 20A, it is preferable to select the materials of the respective layers to cause the organic photoelectric converter 20A of the present embodiment to have an energy level as illustrated in FIGS. 3A and 3B, for example.

For example, in a case where the top-electrode 25 is used as the cathode, as illustrated in FIG. 3A, it is preferable that a work function (WF) of the top-electrode 25, electron affinity EA1 of the upper inter-layer 24, and electron affinity EA2 of an electron acceptor material included in the photoelectric conversion layer 23A have a magnitude relationship of EA2≤EA1≤WF. This makes it possible to satisfy both enhancement of extraction efficiency (quantum efficiency) of signal charges (herein electrons) generated in the photoelectric conversion layer 23A and reduction in a dark current. In addition, it is preferable to use a material in which an ionization potential (IP1) of the upper inter-layer 24 is larger than the work function (WF) of the top-electrode 25 and an ionization potential (IP2) of an electron donor material included in the photoelectric conversion layer 23A. This makes it possible to efficiently suppress injection of the holes from the top-electrode 25.

For example, in a case where the top-electrode 25 is used as the anode, as illustrated in (B) of FIG. 3, it is preferable to use a material where the electron affinity EA1 of the upper inter-layer 24 is larger than the work function (WF) of the top-electrode 25. This makes it possible to satisfy both enhancement of extraction efficiency (quantum efficiency) of signal charges (herein, holes) generated in the photoelectric conversion layer 23A and reduction in a dark current.

The fixed charge layer 26 may be a film having positive fixed charges or a film having negative fixed charges. Materials of the film having the negative fixed charges include hafnium oxide, aluminum oxide, zirconium oxide, tantalum oxide, titanium oxide, etc. In addition to the foregoing materials, lanthanum oxide, praseodymium oxide, cerium oxide, neodymium oxide, promethium oxide, samarium oxide, europium oxide, gadolinium oxide, terbium oxide, dysprosium oxide, holmium oxide, thulium oxide, ytterbium oxide, lutetium oxide, yttrium oxide, an aluminum nitride film, a hafnium oxynitride film, or an aluminum oxynitride film, etc. may also be used.

The fixed charge layer 26 may have a configuration in which two or more kinds of films are stacked. This makes it possible to further enhance a function as a hole accumulation layer, for example, in the case of the film having the negative fixed charges.

Although materials of the dielectric layer 27 are not specifically limited, the dielectric layer 27 is formed with use of for example, a silicon oxide film, TEOS, a silicon nitride film, a silicon oxynitride film, etc.

The inter-layer insulating layer 28 includes, for example, a single-layer film including one kind of silicon oxide, silicon nitride, silicon oxynitride (SiON) or the like, or a laminated film including two or more kinds thereof.

The protective layer 29 includes a material having optical transparency, and includes, for example, a single-layer film including any of silicon oxide, silicon nitride, and silicon oxynitride (SiON), or a laminated film including two or more kinds thereof. The protective layer 29 has a thickness in a range from 100 nm to 30000 nm, for example.

The semiconductor substrate 30 includes a n-type silicon (Si) substrate, for example, and has a p-well 31 in a predetermined region. The vertical type transistor Tr1, the transfer transistor Tr2, the amplifier transistor AMP, and the reset transistor RST, etc., described above are provided on the second surface 30B of the p-well 31. In addition, peripheral circuits (not illustrated) including a logic circuit, etc., are provided in a periphery of the semiconductor substrate 30.

The inorganic photoelectric conveners 32B and 32R each have a p/n junction in a predetermined region of the semiconductor substrate 30. The inorganic photoelectric conveners 32B and 32R enable dispersion of light in a longitudinal direction with use of a difference in wavelength of absorbed light depending on a depth of light incidence in the silicon substrate. The inorganic photoelectric converter 32B selectively detects blue light to accumulate signal charges corresponding to blue, and is disposed at a depth that allows for efficient photoelectric conversion of blue light. The inorganic photoelectric converter 32R selectively detects red light to accumulate signal charge corresponding to red, and is disposed at a depth that allows for efficient photoelectric conversion of red light. It is to be noted that blue (B) and red (R) are colors respectively corresponding to a wavelength range of 450 nm to 495 nm, for example, and a wavelength range of 620 nm to 750 nm, for example. It is only necessary to allow each of the inorganic photoelectric converters 32B and 32R to detect light in a portion or the entirety of each of the wavelength ranges.

The inorganic photoelectric converter 32B includes a p+ region serving as a hole accumulation layer, and an n region serving as an electron accumulation layer, for example. The inorganic photoelectric convener 32R has a p+ region serving as a hole accumulation layer, and an n region serving as an electron accumulation layer (has a stacking structure of p-n-p), for example. The n region of the inorganic photoelectric converter 32B is coupled to the vertical type transistor Tr1. The p+ region of the inorganic photoelectric convener 32B bends along the vertical type transistor Tr1 and is connected to the p+ region of the inorganic photoelectric converter 32R.

The vertical type transistor Tr1 is a transfer transistor that transfers, to the floating diffusion FD1, signal charges (electrons in the present embodiment) corresponding to blue generated and accumulated in the inorganic photoelectric converter 32B. The inorganic photoelectric converter 32B is formed at a position deep from the second surface 30B of the semiconductor substrate 30: therefore, the transfer transistor of the inorganic photoelectric converter 32B preferably includes the vertical type transistor Tr1.

The transfer transistor Tr2 transfers, to the floating diffusion FD2, signal charges (electrons in the present embodiment) corresponding to red generated and accumulated in the inorganic photoelectric converter 32R, and includes a MOS transistor, for example.

The amplifier transistor AMP is a modulation element that modulates an amount of charges generated in the organic photoelectric converter 20A into voltage, and includes a MOS transistor, for example.

The reset transistor RST resets the charges transferred from the organic photoelectric converter 20A to the floating diffusion FD3, and includes a MOS transistor, for example.

The first lower contact 35, the second lower contact 45, the third lower contact 46, and the upper contact 36 each include, for example, a doped silicon material such as PDAS (Phosphorus Doped Amorphous Silicon) or a metal material such as aluminum (Al), tungsten (W), titanium (Ti), cobalt (Co), hafnium (Hf), and tantalum (Ta).

FIG. 4 is a plan view of a configuration example of the solid-state imaging apparatus (the solid-state imaging apparatus 1, for example) having the unit pixel P in which a plurality of photoelectric converters (for example, the foregoing inorganic photoelectric converters 32B and 32R and the foregoing organic photoelectric convener 20A) to which the technology according to the present disclosure may be applied are stacked. That is, FIG. 4 illustrates an example of a planar configuration of the unit pixel P that configures a pixel unit 1a illustrated in FIG. 14, for example.

The unit pixel P includes a photoelectric conversion region 1100 where a red photoelectric converter (the inorganic photoelectric converter 32R in FIG. 2), a blue photoelectric converter (the inorganic photoelectric converter 32B in FIG. 2), and a green photoelectric converter (the organic photoelectric converter 20A in FIG. 2) that photoelectrically convert light of respective wavelengths of R (Red), G (Green), and B (Blue) (any of which is not illustrated in FIG. 4) are stacked in three layers in order of, for example, the green photoelectric convener, the blue photoelectric converter, and the red photoelectric converter from a side on which a light receiving surface (the light entering side S1 in FIG. 2). Furthermore, the unit pixel P includes a Tr group 1110, a Tr group 1120, and a Tr group 1130 as charge readout units that read out charges corresponding to the light of the respective wavelengths of RGB from the red photoelectric converter, the green photoelectric convener, and the blue photoelectric convener. In the solid-state imaging apparatus 1, in one unit pixel, dispersion in the longitudinal direction, that is, dispersion of light of each of RGB in each of the layers as the red photoelectric converter, the green photoelectric converter, and the blue photoelectric converter, is performed.

The Tr group 1110, the Tr group 1120, and the Tr group 1130 are formed on the periphery of the photoelectric conversion region 1100. The Tr group 1110 outputs, as a pixel signal, signal charges corresponding to light of R generated and accumulated in the red photoelectric converter. The Tr group 1110 includes a transfer Tr (MOS FET) 1111, a reset Tr 1112, an amplification Tr 1113, and a selection Tr 1114. The Tr group 1120 outputs, as a pixel signal, signal charges corresponding to light of B generated and accumulated in the blue photoelectric converter. The Tr group 1120 includes a transfer Tr 1121, a reset Tr 1122, an amplification Tr 1123, and a selection Tr 1124. The Tr group 1130 outputs, as a pixel signal, signal charges corresponding to light of G generated and accumulated in the green photoelectric converter. The Tr group 1130 includes a transfer Tr 1131, a reset Tr 1132, an amplification Tr 1133, and a selection Tr 1134.

The transfer Tr 1111 includes a gate G, a source/drain region S/D, and an FD (floating diffusion) 1115 (a source drain region serving as a FD). The transfer Tr 1121 includes the gate G, the source/drain region S/D and an FD 1125. The transfer Tr 1131 includes the gate G, the green photoelectric converter (that is, the source/drain region S/D coupled to the green photoelectric converter) in the photoelectric conversion region 1100, and an FD 1135. It is to be noted that the source/drain region of the transfer Tr 1111 is coupled to the red photoelectric converter in the photoelectric conversion region 1100, and the source/drain region S/D of the transfer Tr 1121 is coupled to the blue photoelectric converter in the photoelectric conversion region 1100.

Each of the reset Tr 1112, 1132, and 1122, the amplification Tr 1113, 1133, and 1123, and the selection Tr 1114, 1134, and 1124 includes the gate G and a pair of source/drain regions S/D disposed to interpose the gate G therebetween.

The FD 1115, 1135, and 1125 are respectively coupled to the source/drain regions S/D serving as sources of the reset Tr 1112, 1132, and 1122, and are respectively coupled to the gates G of the amplification Tr 1113, 1133, and 1123. A power source Vdd is coupled to each of the source/drain region S/D common to the reset Tr 1112 and the amplification Tr 1113, the source/drain region S/D common to the reset Tr 1132 and the amplification Tr 1133, and the source drain region S/D common to the reset Tr 1122 and the amplification Tr 1123. A VSL (vertical signal line) is coupled to each of the source drain regions S/D serving as sources of the selection Tr 1114, 1134, and 1124.

The technology according to the present disclosure is applicable to the solid-state imaging apparatus as described above.

(1-2. Method of Manufacturing Solid-State Imaging Element)

It is possible to manufacture the solid-state imaging element 10 of the present embodiment in the following manner, for example.

FIG. 5 to FIG. 8 illustrate the method of manufacturing the slid-slate imaging element 10 in process order. First, as illustrated in FIG. 5, the p-well 31, for example, is formed as a well of a first conductivity type in the semiconductor substrate 30, and the inorganic photoelectric converters 32B and 32R of a second conductivity type (the n type, for example) are formed in this p-well 31. The p+ region is formed in the vicinity of the first surface 30A of the semiconductor substrate 30.

In addition, also as illustrated in FIG. 5, an impurity region (a p+ region) penetrating from the first surface 30A to the second surface 30B of the semiconductor substrate 30 is formed in a region where the through electrode 34 and the separation groove 50 are to be formed. Furthermore, a high-concentration impurity region (a p++ region) is formed in a region where the upper end and the lower end of the through electrode 34 are to be formed.

As also illustrated in FIG. 5, on the second surface 30B of the semiconductor substrate 30, n+ regions serving as the floating diffusions FD1 to FD3 are formed, and thereafter, a gate wiring layer 37 including respective gates of a gate insulation layer 33, the vertical type transistor Tr1, the transfer transistor Tr2, the amplifier transistor AMP, and the reset transistor RST is formed. Thus, the vertical type transistor Tr1, the transfer transistor Tr2, the amplifier transistor AMP, and the reset transistor RST are formed. Furthermore, the multilayer wiring 40 including the first lower contact 35, the second lower contact 45, the third lower contact 46, the wiring layers 41 to 43 including the connection unit 41A, and the insulation layer 44 is formed on the second surface 30B of the semiconductor substrate 30.

As a base substrate of the semiconductor substrate 30, an SOI (Silicon on Insulator) substrate in which the semiconductor substrate 30, an embedded oxide film (not illustrated), and a retaining substrate (not illustrated) are stacked is used. The embedded oxide film and the retaining substrate are not illustrated in FIG. 2, but are joined to the first surface 30A of the semiconductor substrate 30. Annealing treatment is performed after ion implantation.

Next, a supporting substrate (not illustrated), another semiconductor base substrate, or the like is joined to the side on which the second surface 30B is located of the semiconductor substrate 30 (a side on which the multilayer wiring 40 is located) and flipped from top to bottom. Subsequently, the semiconductor substrate 30 is separated from the embedded oxide film and the retaining substrate of the SOI substrate to cause the first surface 30A of the semiconductor substrate 30 to be exposed. It is possible to perform the above processes with technologies used in a typical CMOS process such as ion implantation and CVD (Chemical Vapor Deposition).

Next, as illustrated in FIG. 6, the semiconductor substrate 30 is processed from the side on which the first surface 30A is located by dry etching, for example, to form the annular or circular separation groove 50. The depth of the separation groove 50 preferably penetrates from the first surface 30A to the second surface 30B of the semiconductor substrate 30 to reach the gate insulation layer 33, as indicated by an arrow D50A of FIG. 6. Furthermore, to further enhance an insulating effect in the bottom surface 53 of the separation groove 50, the separation groove 50 preferably penetrates through the semiconductor substrate 30 and the gate insulation layer 33 to reach the insulation layer 44 of the multilayer wiring 40, as indicated by an arrow D50B of FIG. 6. FIG. 6 illustrates a case where the separation groove 50 penetrates through the semiconductor substrate 30 and the gate insulation layer 33.

Subsequently, as illustrated in FIG. 7, for example, the negative fixed charge layer 26 is formed on the outer surface 51, the inner surface 52, and the bottom surface 53 of the separation groove 50 and on the first surface 30A of the semiconductor substrate 30. Two or more kinds of films may be stacked as the negative fixed charge layer 26. This makes it possible to further enhance a function as the hole accumulation layer. After the negative fixed charge layer 26 is formed, the dielectric layer 27 having the outer dielectric layer 27A and the inner dielectric layer 27B is formed. At this time, the cavity 54 is formed between the outer dielectric layer 27A and the inner dielectric layer 27B in the separation groove 50 through appropriately adjusting a film thickness of the dielectric layer 27 and film-forming conditions.

Next, as illustrated in FIG. 8, the inter-layer insulating layer 28 is formed. Subsequently, the bottom-electrode 21, the lower inter-layer 22, the photoelectric conversion layer 23A, the upper inter-layer 24, the top-electrode 25, and the protective layer 29 are formed on the inter-layer insulating layer 28. In addition, the upper contact 36 is formed and coupled to the upper end of the through electrode 34. Lastly, the optical member such as the planarization layer and the on-chip lens (not illustrated) are disposed. Thus, the solid-state imaging element 10 illustrated in FIG. 2 is completed.

In the solid-state imaging element 10, in a case where light enters the organic photoelectric converter 20A via the on-chip lens (not illustrated), the light passes through the organic photoelectric converter 20A and the inorganic photoelectric converters 32B and 32R in order, and each of green light, blue light, and red light is photoelectrically converted in the course of passing. In the following, signal acquisition operations of the respective colors are described.

(Acquisition of Green Signal by Organic Photoelectric Converter 20)

Of the light entering the solid-state imaging element 10, first, green light is selectively detected (absorbed) and photoelectrically convened in the organic photoelectric converter 20A.

The organic photoelectric converter 20A is coupled to the gate Gamp of the amplifier transistor AMP and the floating diffusion FD3 via the through electrode 34. Thus, herein, electrons of the electron-hole pairs generated in the organic photoelectric convener 20A is retrieved from the side on which the top-electrode 25 is located, transferred to the side on which the second surface 30B is located of the semiconductor substrate 30 via the through electrode 34, and accumulated in the floating diffusion FD3. Simultaneously with this, the amount of charges generated in the organic photoelectric converter 20A is modulated into voltage by the amplifier transistor AMP.

In addition, the reset gale Grst of the reset transistor RST is disposed adjacent to the floating diffusion FD3. Accordingly, the charges accumulated in the floating diffusion FD3 are reset by the reset transistor RST.

Herein, the organic photoelectric converter 20A is coupled not only to the amplifier transistor AMP but also to the floating diffusion FD3 via the through electrode 34, thus making it possible for the reset transistor RST to easily reset the charges accumulated in the floating diffusion FD3.

In contrast, in a case where the through electrode 34 is not coupled to the floating diffusion FD3, it is difficult to reset the charges accumulated in the floating diffusion FD3, causing the charges to be drawn to a side on which the top-electrode 25 is located by application of a large voltage. This may damage the photoelectric conversion layer 23A. In addition, a configuration that enables resetting in a short period of time causes an increase dark time noise, thereby resulting in a trade-off; therefore, this configuration is difficult.

(Acquisition of Blue Signal and Red Signal by Inorganic Photoelectric converters 32B and 32R)

Subsequently, blue light and red light of the light having passed through the organic photoelectric converter 20A are absorbed and photoelectrically convened in order respectively in the inorganic photoelectric converter 32B and the inorganic photoelectric convener 32R. In the inorganic photoelectric convener 32B, electrons corresponding to the incident blue light are accumulated in the n region of the inorganic photoelectric converter 32B, and the accumulated electrons are transferred to the floating diffusion FD1 by the vertical type transistor Tr1. Similarly, in the inorganic photoelectric converter 32R, electrons corresponding to the incident red light are accumulated in the n region of the inorganic photoelectric converter 32R, and the accumulated electrons are transferred to the floating diffusion FD2 by the transfer transistor Tr2.

(1-3 Workings and Effects)

In the solid-state imaging element using the organic semiconductor materials, as described above, the photoelectric conversion layer including the p-type and n-type organic semiconductor materials is formed to allow for efficient charge generation and charge transport. Whether a certain organic semiconductor material used for the photoelectric conversion layer functions as the p-type semiconductor or the n-type semiconductor is determined by a relative relationship between an energy level of the organic semiconductor material and an energy level of a material used together.

In the organic semiconductor, a level difference between HOMO and LUMO corresponds to a bandgap (Eg), and an energy difference between the HOMO and a vacuum level is referred to as an ionization potential (I) and the energy difference between the LUMO and the vacuum level is referred to as electron affinity ($\chi$). For example, in a case where one organic semiconductor material of two kinds of organic semiconductor materials included in the photoelectric conversion layer has higher electron affinity than the other organic semiconductor material, the one organic semiconductor material has a higher electron-withdrawing property than the other organic semiconductor material. Therefore, the one organic semiconductor material functions as the n-type semiconductor and the other organic semiconductor material functions as the p-type semiconductor. Examples of a method of causing the organic semiconductor material to have an n-type property include a method of introducing, into a molecule structure, a halogen atom having large electronegativity. For example, the above-described boron subphthalocyanine chloride used with quinacridone functions as the n-type semiconductor.

In addition, as described above, an organic photoelectric conversion element is reported in which an electron blocking layer and a hole blocking layer are each provided between the photoelectric conversion layer and a pair of electrodes to further enhance electron extraction efficiency. In the organic photoelectric conversion element having such a configuration, to make it easier to extract charges (electrons) generated in the photoelectric conversion layer, it is desirable to form the hole blocking layer using a material having a deeper LUMO value (high electron affinity) than an organic semiconductor material that functions as the n-type semiconductor in the photoelectric conversion layer. Therefore, in general, an organic semiconductor material having a halogen atom in a molecule is also used for the material of the hole blocking layer.

However, in a case where the material (the organic semiconductor material) having the halogen atom in the molecule is used as the material of the organic semiconductor layer provided between the pair of electrodes, the halogen atom included in the molecule of the organic semiconductor material may be desorbed due to exposure of the organic semiconductor layer to ultraviolet rays used during formation of the top-electrode or formation of the protection film. The desorbed halogen atom diffuses to the side on which the top-electrode is located. At this time, in a case where the electrode material of the top-electrode includes a metal oxide including indium, such as ITO, the desorbed halogen atom and the metal oxide react, causing a metal element to be eluted. The eluted metal element thermally diffuses into the photoelectric conversion layer during manufacturing of the solid-state imaging element. The metal element diffused into the photoelectric conversion layer causes deterioration in dark current characteristics.

It is conceivable that desorption of the halogen atom as described above occurs most easily in a layer directly under the top-electrode (in contact with the top-electrode).

In contrast, in the present embodiment, the upper inter-layer 24 in which a concentration of the organic semiconductor material having the halogen atom in the molecule is in a range from 0 volume % to less than 0.05 volume % is provided between the photoelectric conversion layer 23A and the top-electrode 25. This makes it possible to suppress modification of metal oxide included in the top-electrode 25 and the organic material included in the organic photoelectric converter 20A (for example, the organic semiconductor material included in the upper inter-layer 24) during formation of the top-electrode 25.

In the present embodiment, the upper inter-layer 24 in which the concentration of the organic semiconductor material having the halogen atom in the molecule is in a range from 0 volume % to less than 0.05 volume % is provided between the photoelectric conversion layer 23A and the top-electrode 25, which thus suppresses the modification of the metal oxide included in the top-electrode 25 and the organic semiconductor material included in the upper inter-layer 24 during formation of the top-electrode 25. Therefore, the dark current characteristics are improved, thereby making it possible to provide the solid-state imaging element 10 having excellent electric characteristics.

Next, description is given of second to sixth embodiments. In the following, same components as those in the foregoing first embodiment are denoted by same reference numerals, and description thereof is omitted where appropriate.

2. SECOND EMBODIMENT

FIG. 9 schematically illustrates a cross-sectional configuration of a photoelectric converter 20B that configures a solid-state imaging element according to the second embodiment of the present disclosure. Similarly to the foregoing first embodiment, the organic photoelectric converter 20B of the present embodiment is of the so-called longitudinal direction spectral type in which, for example, one organic photoelectric converter 20B and two inorganic photoelectric conveners 32B and 32R (see FIG. 2) are stacked m the longitudinal direction. In the present embodiment, the photoelectric conversion layer 23B is configured with use of an organic semiconductor material that has one or two or more halogen atoms in a molecule.

Desorption of the halogen atom, as described in the foregoing first embodiment, from the organic semiconductor layer that is provided between the pair of electrodes and configured with use of the material having the halogen atom in the molecule also occurs in a case where the photoelectric conversion layer 23B is formed with use of live organic semiconductor material having the halogen atom in the molecule. In this case, using, as the material included in the photoelectric conversion layer 23B, an organic semiconductor material in which binding energy of the halogen atom having the smallest binding energy of one or two or more halogen atoms included in the molecule is 5.4 eV or higher makes it possible to suppress modification of the metal oxide included in the top-electrode 25 and the organic semiconductor material included in the photoelectric conversion layer 23B during formation of the top-electrode 25.

It is to be noted that similarly to the material of the photoelectric conversion layer 23A in the foregoing first embodiment, examples of the material of the photoelectric conversion layer 23B in the present embodiment include quinacridone, boron subphthalocyanine chloride, pentacene, benzothieno-benzothiphene, fullerene, and derivatives thereof, except that the photoelectric conversion layer 23B has one or more halogen atoms in the molecule.

As described above, in the present embodiment, the photoelectric conversion layer 23B is formed with sue of the organic semiconductor material having one or two or more halogen atoms in the molecule in which binding energy of the halogen atom having the smallest binding energy in the molecule is 5.4 eV or higher. Accordingly, the organic photoelectric converter 20B has effects similar to those of the foregoing first embodiment.

3. THIRD EMBODIMENT

FIG. 10 schematically illustrates a cross-sectional configuration of a photoelectric convener 20C that configures a solid-state imaging element according to a third embodiment of the present disclosure. Similarly to the foregoing first embodiment, the organic photoelectric converter 20C of the present embodiment is of the so-called longitudinal direction spectral type in which, for example, one organic photoelectric converter 20B and two inorganic photoelectric conveners 32B and 32R (see FIG. 2) are stacked in the longitudinal direction. In the present embodiment, a distance between the photoelectric conversion layer 23B and the top-electrode 25 is set to 5 nm or larger.

In a case where a material having a halogen atom in a molecule is used as the material included in the photoelectric conversion layer 23, as in the foregoing first embodiment, even if the concentration of the organic semiconductor material having the halogen atom in the molecule in the upper inter-layer 24 is 0 volume %, desorption of the halogen atom in the photoelectric conversion layer 23 may occur due to irradiation with ultraviolet rays, etc. during formation of the top-electrode 25 or the protective layer 29, thereby modifying the organic material included in the top-electrode 25 or the solid-state imaging element 10.

In contrast, in the present embodiment, the upper inter-layer 24B that is formed with use of a material having no halogen atom in a molecule and has a thickness of 5 nm or larger is provided between the photoelectric conversion layer 23 including the organic semiconductor material having the halogen atom in the molecule and the top-electrode 25. Examples of the material included in the upper inter-layer 24 include a material including a pyridine skeleton, a pyrimidine skeleton, or a triazine skeleton in a molecule. Specific examples thereof include B3PyMPM (bis-4,6-(3,5-di-3-pyridylphenyl)-2-methylpyrimi-dine), B4P6mPM, etc.

As described above, in the present embodiment, the upper inter-layer 24B having a thickness of 5 nm or larger is provided between the photoelectric conversion layer 23 and the top-electrode 25, and as the material thereof, the organic semiconductor material having no halogen atom in the molecule is used. Accordingly, the organic photoelectric converter 20C has effects similar to those in the foregoing first embodiment.

It is to be noted that the present technology may have a configuration in which the first embodiment and the second embodiment are combined, the first embodiment and the third embodiment are combined, or the first embodiment, the second embodiment, and the third embodiment are combined.

4. FOURTH EMBODIMENT

FIG. 11 schematically illustrates a cross-sectional configuration of a photoelectric converter 60 that configures a solid-state imaging element according to a fourth embodiment of the present disclosure. The solid-state imaging element of the present embodiment configures one pixel (unit pixel P) in a solid-state imaging apparatus (the solid-state imaging apparatus 1: see FIG. 16) such as a CMOS image sensor used in an electronic apparatus such as a digital still camera and a video camera, for example.

(4-1. Configuration of Organic Photoelectric Converter)

Similarly to the foregoing first embodiment, the solid-state imaging element of the present embodiment is of a so-called longitudinal direction spectral type in which, for example, one organic photoelectric converter 60 and two inorganic photoelectric conveners 32B and 32R (see FIG. 2) are stacked in the longitudinal direction. The organic photoelectric converter 60 is provided on the side on which the first surface (the back side) 30A is located of the semiconductor substrate 30. The inorganic photoelectric conveners 32B and 32R are formed to be embedded in the semiconductor substrate 30, and are stacked in the thickness direction of the semiconductor substrate 30.

The organic photoelectric converter 60 of the present embodiment includes a pair of electrodes (a bottom-electrode 61 and a top-electrode 64), and an exciton blocking layer 62 and a photoelectric conversion layer 63 provided between the pair of electrodes. In the present embodiment, the photoelectric conversion layer 63 is configured by two layers, i.e., an exciton generation layer 63A including a dye material and a first semiconductor material and an exciton disassociation layer 63B including a second semiconductor material.

In the solid-state imaging element of the present embodiment, light entering the organic photoelectric convener 60 from a side on which the top-electrode 64 is located is absorbed by the exciton generation layer 63A of the photoelectric conversion layer 63. Excitons generated thereby move to the disassociation layer 63B, and are disassociated into electrons and holes. Charges (electrons and holes) generated here are each carried to different electrodes by diffusion resulting from a difference in concentration of carriers or an internal electric field resulting from a difference in work function between a negative electrode (herein, the bottom-electrode 61) and a positive electrode (herein, the top-electrode 64), and are detected as a photocurrent. In addition, it is possible to control transport directions of the electrons and the holes by application of a potential between the bottom-electrode 61 and the top-electrode 64.

In the following, description is given of the configurations, materials, etc. of respective components.

The organic photoelectric converter 60 is a photoelectric conversion element that absorbs green light corresponding to a portion or the entirely of a selective wavelength range (for example, 495 nm to 570 nm) to generate the electron-hole pairs.

The bottom-electrode 61 is directly opposed to the light receiving surfaces of the inorganic photoelectric converters 32B and 32R formed in the semiconductor substrate 30, illustrated in FIG. 2, for example, and is provided in regions covering the light receiving surfaces. The bottom-electrode 61 is configured with a conductive material having optical transparency (a transparent conductive material), and includes ITO (indium tin oxide), for example. However, in addition to ITO, a tin oxide ($SnO_2$)-based material to which a dopant is added or a zinc oxide-based material prepared through adding a dopant to aluminum zinc oxide (ZnO) may be used as a constituent material of the bottom-electrode 61. Examples of the zinc oxide-based material include aluminum zinc oxide (AZO) to which aluminum (Al) is added as a dopant, gallium zinc oxide (GZO) to which gallium (Ga) is added, and indium zinc oxide (IZO) to which indium (In) is added. In addition to these materials, aluminum (Al), CuI, $InSbO_4$, $ZnMgO$, $CuInO_2$, $MgIn_2O_4$, CdO, $ZnSnO_3$, etc. may also be used. In the solid-state imaging apparatus 1 that uses the solid-state imaging element 10 as one pixel, the bottom-electrode 61 may be separated for each pixel or may be formed as a common electrode for respective pixels.

The exciton blocking layer 62 prevents the excitons generated in the exciton generation layer 63A, for example, from being deactivated by the bottom-electrode 61. In a case where a relation of energy levels of the respective layers that configure the organic photoelectric converter 60, for example, is established as illustrated in FIG. 12A and FIG. 12B to be described later, an electron transport material is preferably used as a material that forms an exciton blocking layer 62A. Specific examples of the electron transport material include Bathocuproine (BCP), 2,9-Bis(naphthalen-2-yl)-4,7-diphenyl-1,10-phenanthroline (NBphen), 2,2′,2″-(1, 3,5-Benzinetriyl)-tris(1-phenyl-1-H-benzimidazole) (TPBi), (S-Quinolinolato) lithium (Liq). 2-(4-tert-Butylphenyl)-5-(4-biphenylyl)-1,3,4-oxadiazole (PBD), 1,3-bis[5-(4-tert-butylphenyl)-2-[1,3,4]oxadiazolyl]benzene (OXD-7), 3-(Biphenyl-4-yl)-5-(4-tert-butylphenyl)-4-phenyl-4H-1,2,4-triazol (TAZ), 4,4′-Bis(4,6-diphenyl-1,3,5-triazin-2-yl) biphenyl (BTB), Bis-4,6-(3,5-di-4-pyridylphenyl)-2-methylpyrimidine (B4PyMPM), etc. In addition, for example, in a case where the relation of the energy levels of the respective layers that configure the organic photoelectric converter 60 is established as illustrated in FIG. 13A and FIG. 13B to be described later, a hole transport material is preferably used. Specific examples of the hole transport material include triarylamine derivatives (such as TPD, NPB, and TAPC), carbazole derivatives (such as CBP and TCTA), and fluorene derivatives (such as BSBF). It is preferable that the exciton blocking layer 62A have a thickness in a range from 1 nm to 50 nm, for example.

The photoelectric conversion layer 63 converts optical energy into electric energy. As described above, the photoelectric conversion layer 63 is configured by the two layers, i.e., the exciton generation layer 63A and the exciton disassociation layer 63B. The exciton generation layer 63A is a layer including the dye material and the first semiconductor material and has a bulk heterojunction interface configured by the dye material and the first semiconductor material. Light entering the organic photoelectric converter 60 is absorbed by the dye material at the bulk heterojunction interface, and transfer of energy to the first semiconductor material generates excitons on the first semiconductor material. The exciton disassociation layer 63B includes the second semiconductor material. In the exciton disassociation layer 63B, the excitons diffused from the exciton generation layer 63A are disassociated into charges (electrons and holes). It is to be noted that as a positional relation of the exciton generation layer 63A and the exciton disassociation layer 63B, the exciton disassociation laser 63B is preferably disposed on the light entering side S1, for example. This is because density of the excitons generated in the exciton generation layer 63A is high on a side on which the light entering surface is located, and a distance (diffusion distance) at which the generated excitons move to the exciton disassociation layer 63B is preferably short in order to enhance photoelectric conversion efficiency.

In the dye material and the first semiconductor material included in the exciton generation layer 63A, it is preferable that the first semiconductor material, for example, have a bandgap substantially equal to, or smaller than a bandgap of the dye material. This facilitates energy transfer from the dye material to the first semiconductor material. The first semiconductor material and the second semiconductor material are the p-type semiconductor or the n-type semiconductor, and are semiconductor materials that have polarities different from each other. In addition, it is preferable that the first semiconductor material and the second semiconductor material have a difference in energy level. This makes it possible to quickly transfer charges (electrons and holes) generated in the exciton disassociation layer 63B to the bottom-electrode 61 and the top-electrode 64.

FIGS. 12A, 12B, 13A, and 13B each illustrate the exciton generation layer 63A and the exciton dissociation layer 63B and a combination of the energy levels of the dye material the first semiconductor material, and the second semiconductor material that are included therein. For example, in a case holes are used as charges, as illustrated in FIG. 12A, it is preferable that the first semiconductor material included in the exciton generation layer 63A have a deeper HOMO level and a deeper LUMO level than the second semiconductor material included in the exciton disassociation layer 63B. In a case of such a combination of the energy levels, the first semiconductor material is the n-type semiconductor and the second semiconductor material is the p-type semiconductor. As for the energy level of the dye material, for example, the LUMO levels of the dye material and the first semiconductor material may be equal to each other, as illustrated in FIG. 12A, or the HOMO levels of the dye material and the first semiconductor material may be equal to each other, as illustrated in FIG. 12B.

In a case where electrons are used as charges, as illustrated in FIG. 13A, it is preferable that the first semiconductor material included in the exciton generation layer 63A have a shallower HOMO level and a shallower LUMO level than the second semiconductor material included in the exciton disassociation layer 63B. In a case of such a combination of the energy levels, the first semiconductor material is the p-type semiconductor and the second semiconductor material is the n-type semiconductor. As for the energy level of the dye material, for example, the LUMO levels of the dye material and the first semiconductor material may be equal to each other, as illustrated in FIG. 13A, or the HOMO levels of the dye material and the first semiconductor material may be equal to each other, as illustrated in FIG. 13B.

The materials used as the first semiconductor material and the second semiconductor material are preferably organic materials, and include the following materials in the case of the combination of the energy levels illustrated in FIG. 12A. As the dye material, a material having a high linear absorption coefficient of a maximal absorption wavelength in a visible light region is preferable. This makes it possible to increase absorption capacity of light in the visible light region in the organic photoelectric converter 60 and have a sharp spectral shape. Examples of such a material include subphthalocyanine or a derivative thereof expressed by a general formula (1). Specific examples of the material include $F_6SubPcOC_6F_5$. Examples of the first semiconductor material (the n-type semiconductor) include fullerene or a derivative thereof expressed by a general formula (2) or a general formula (3). Examples of the second semiconductor material (the p-type semiconductor) include thiophene or a derivative thereof expressed by a general formula (4). It is to be noted that in the present disclosure, fullerene is treated as the organic semiconductor material.

[Chem. 1]

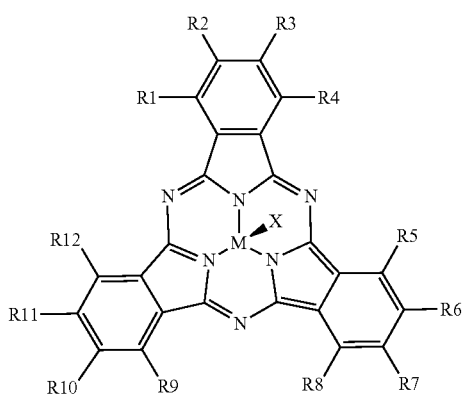

(1)

(R1 to R12 are each independently selected from a group configured of hydrogen atom, a halogen atom, a straight-chain, branched, or cyclic alkyl group, a thioalkyl group, a thioaryl group, an aryl sulfonyl group, an alkyl sulfonyl group, an amino group, an alkyl amino group, an aryl amino group, a hydroxy group, an alkoxy group, an acyl amino group, an acyloxy group, a phenyl group, a carboxy group, a carboxamide group, a carboalkoxy group, an acyl group, a sulfonyl group, a cyano group, and a nitro group, and any adjacent ones of R1 to R12 are optionally part of a condensed aliphatic ring or a condensed aromatic ring. The condensed aliphatic ring or the condensed aromatic ring described above optionally includes one or more atoms other than carbon. M is boron or a divalent or trivalent metal. X is an anionic group.)

[Chem. 2]

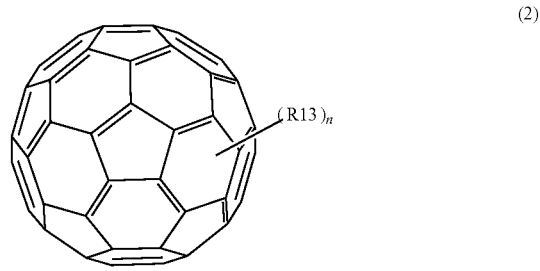

(2)

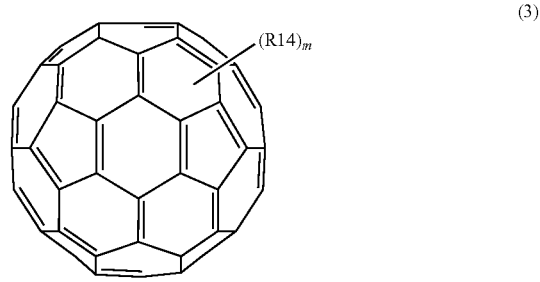

(3)

(R13 and R14 are each independently one of a hydrogen atom, a halogen atom, a straight-chain, branched, or cyclic alkyl group, a phenyl group, a group having a straight-chain or condensed ring aromatic compound, a group having a halogen compound, a partial fluoroalkyl group, a perfluoroalkyl group, a silyl alkyl group, a silyl alkoxy group, an aryl silyl group, an aryl sulfanyl group, an alkyl sulfanyl group, an aryl sulfonyl group, an alkyl sulfonyl group, an aryl sulfide group, an alkyl sulfide group, an amino group, an alkyl amino group, an aryl amino group, a hydroxy group, an alkoxy group, an acyl amino group, an acyloxy group, a carbonyl group, a carboxy group, a carboxamide group, a carboalkoxy group, an acyl group, a sulfonyl group, a cyano group, a nitro group, a group having a chalcogen compound, a phosphine group, a phosphone group, and derivatives thereof. Each of n and m is an integer of 1 or larger.)

[Chem. 3]

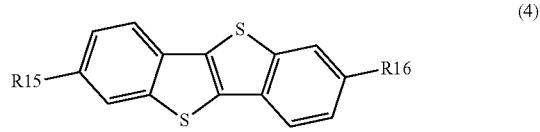

(4)

(4')

(R15 and R16 are each independently a hydrogen atom or a substituent group expressed by a formula (4'). R17 is an aromatic ring group or an aromatic ring group having a substituent group.)

It is to be noted that the material included in the photoelectric conversion layer 63 is not particularly limited. Besides the materials listed above, examples of the material include naphthalene, anthracene, phenantherene, tetracene, pyrene, perylene, fluoranthene, and derivatives thereof. Alternatively, a polymer such as phenylenevinylene, fluorene, carbazole, indole, pyrene, pyrrole, picoline, thiophene, acetylene, and diacetylene, or a derivative thereof may be used. Additionally, it is possible to preferably use a metal complex dye, a cyanine-based dye, a merocyanine-based dye, a phenylxanthene-based dye, a triphenylmethane-based dye, a rhodacyanine-based dye, a xanthene-based dye, a macrocyclic azaannulene-based dye, an azulene-based naphthaquinone, an anthraquinone-based dye, a chain compound in which a condensed polycyclic aromatic group such as anthracene and pyrene and an aromatic ring or a heterocyclic compound are condensed, a cyanine-like dye bonded by two nitrogen-containing hetero rings such as quinoline, benzothiazole, and benzoxazole that have a squarylium group and croconic methine group as a bonded chain, or by ae squarylium group or a croconic methine group, etc. It is to be noted that the foregoing metal complex dye is preferably, but not limited to, a dithiol metal complex-based dye, a metallophthalocyanine dye, a metalloporphyrine dye, or a ruthenium complex dye.

It is preferable that the exciton generation layer 63A have the thickness in a range of 50 nm to 300 nm, for example. It is preferable that the exciton disassociation layer 63B have a thickness in a range from 5 nm to 100 nm, for example.

It is to be noted that any other layer, for example, a buffer film may be provided between the photoelectric conversion layer 63 and the bottom-electrode 61 and between the photoelectric conversion layer 63 and the top-electrode 64. In addition, for example, an undercoat layer, a hole transport layer, an electron blocking film, the photoelectric conversion layer 63, a hole blocking film, the buffer film, an electron transport layer, a work coefficient adjustment film, etc. may also be stacked in order from side on which the bottom-electrode 61 is located.

The top-electrode 64 includes a conductive film having optical transparency similar to the bottom-electrode 61. In the solid-state imaging apparatus 1 that uses the sold-state imaging element 10 as one pixel, the top-electrode 64 may be separated for each pixel, or may be formed as a common electrode for respective pixels. The top-electrode 64 has a thickness in a range from 10 nm to 200 nm, for example.

(4-2. Workings and Effects)

In recent years, in the solid-state imaging apparatus such as a CCD image sensor or a CMOS image sensor, high color reproducibility, a high frame rate, and high sensitivity have been in demand. To achieve them, an excellent spectral shape, high responsivity, and high external quantum efficiency (EQE) are in demand.

For example, in an imaging element (a solid-state imaging element) having a slacking structure of an organic photoelectric conversion film and an inorganic photoelectric converter that performs silicon bulk spectroscopy, the organic photoelectric conversion film in general includes two kinds of materials that function as the p-type semiconductor or the n-type semiconductor. Hie organic photoelectric conversion film includes a bulk heterojunction interface (an P/N interface) formed, in a film, by the p-type semiconductor and the n-type semiconductor. Excitons generated in the organic photoelectric conversion film by light absorption are disassociated (separated) into carriers (electrons and holes) generated at the bulk heterojunction interface. Of the carriers generated at the bulk heterojunction interface, electrons are transported to one electrode by the n-type semiconductor, and holes are transported to the other electrode by the p-type semiconductor.

To achieve high responsivity in the solid-state imaging element provided with the organic photoelectric conversion film including the two kinds of materials (two elements), it is necessary for both the p-type semiconductor and the n-type semiconductor to have high charge transport characteristics. Therefore, to achieve an excellent spectral shape, high responsivity, and high external quantum efficiency, it is necessary for either the p-type semiconductor or the n-type semiconductor to have both sharp spectral characteristics and high charge mobility. However, in general, a material having a sharp spectral shape in a solid film lends not to have high charge transport characteristics. Thus, it is extremely difficult to achieve an excellent spectral shape, high responsivity, and high external quantum efficiency by the two kinds of materials.

Hence, a material having a sharp spectral shape (a dye material, for example) is separately prepared, and a solid-state imaging element provided with an organic photoelectric conversion film including a mixture of three kinds of materials (three elements), i.e., the dye material, and a p-type semiconductor and an n-type semiconductor that have high charge transport characteristics is conceivable. For a photoelectric conversion mechanism in the photoelectric conversion film formed by mixing of the foregoing three kinds of materials, three paths (a path A, a path B, and a path C) are assumed. In the organic photoelectric conversion film in which the three kinds of materials are mixed, first, the dye material absorbs light and enters an excited state. The dye material in the excited state may follow the three paths (the path A, the path B, and the path C) thereafter.

In the path A, energy is transferred from the dye material in the excited state to the n-type semiconductor, and the n-type semiconductor enters the excited state. Thereafter, disassociation of excitons occurs between the n-type semiconductor and the p-type semiconductor, and holes are generated on the p-type semiconductor and the electrons are generated on the n-type semiconductor. Each of the holes and the electrons is transported to a corresponding electrode by an electric field. It is to be noted that although a path where energy of the dye material is transferred to the p-type semiconductor is conceivable, in general, the p-type semiconductor often has a wider bandgap than that of the dye material. Thus, energy transfer from the dye material to the p-type semiconductor is less likely to occur.

In the path B, disassociation of excitons occurs between the dye material and the p-type semiconductor, and electrons are generated on the dye material and the holes are generated on the p-type semiconductor. The electrons on the dye material move to the n-type semiconductor for stabilization. Each of the holes on the p-type semiconductor and the electrons having moved to the n-type semiconductor is transported to a corresponding electrode by an electric field, similarly to the path A.

In the path C, disassociation of excitons occurs between the dye material and the n-type semiconductor, and holes are generated on the dye material and electrons are generated on the n-type semiconductor. The holes on the dye material move to the p-type semiconductor for stabilization. Each of the electrons on the n-type semiconductor and the holes having moved to the p-type semiconductor is transported to a corresponding electrode by an electric field, similarly to the path A.

As described above, all reactions of the foregoing path A, the foregoing path B, and the foregoing path C may occur in the organic photoelectric conversion film formed by mixing of the three kinds of materials. However, in general, carrier transport performance of the dye material is low. Accordingly, in a case where the holes or the electrons are generated on the dye material as in the path B or the path C, expected photoelectric conversion efficiency or expected responsivity may not be achieved due to the low carrier transport performance.

In contrast, in the present embodiment, the photoelectric conversion layer 63 includes two layers, i.e., the exciton generation layer 63A including the dye material and the p-type semiconductor or the n-type semiconductor and the exciton disassociation layer 63B including the n-type semiconductor or the p-type semiconductor. This achieves a configuration in which a light absorbing field (the exciton generation layer 63A) and a charge generating field (the exciton disassociation layer 63B) are separated, that is, a configuration in which the dye material is not in direct contact with a charge transport material (the second semiconductor material), thus causing the path A of the foregoing two paths to be selected.

As described above, in the present embodiment, the photoelectric conversion layer 63 including the exciton generation layer 63A and the exciton disassociation layer 63B is provided, thus reducing occurrence of exciton disassociation on the dye material having low carrier transport performance. Therefore, disassociation of excitons easily occurs between the p-type semiconductor and the n-type semiconductor that have high carrier transport performance, thus making it possible to enhance responsivity. In addition, it is also possible to enhance photoelectric conversion efficiency.

In addition, in a case where a solid film in which a plurality of materials are mixed is formed, a mixing state varies depending on compatibility among the respective materials. In a case where the solid film including a plurality of materials is used as the photoelectric conversion layer, it is preferable that the solid film take a certain level of phase separation structure to cause a carrier transfer path (percolation) to function. In a case where the compatibility among the respective materials is high, however, the solid film is a layer in which the respective materials are uniformly mixed, and in a case where the compatibility among the respective materials is low, the solid film is widely phase-separated. Both the cases are not desirable as the photoelectric conversion layer. As described above, in a case w here the photoelectric conversion layer is formed with use of the mixture of the three kinds of materials, it is difficult to control compatibility among all the three kinds of materials to establish an ideal phase-separating structure.

In contrast, in the present embodiment, as described above, the respective layers (the exciton generation layer 63A and the exciton disassociation layer 63B) that configure the photoelectric conversion layer 63 include not more than two kinds of materials, which thus makes it easy to establish a preferable phase-separating structure. In addition, flexibility in the combination of the materials is improved.

Furthermore, the photoelectric conversion layer 63 has a two-layer configuration (the exciton generation layer 63A and the exciton disassociation layer 63B) including not more than two kinds of materials, which thus makes it possible to significantly simplify, for example, a manufacturing apparatus, such as a vapor deposition source, a power source, and a control panel, prepared in a case where the photoelectric conversion layer 63 is formed with use of a vapor deposition method, and a manufacturing method.

It is to be noted that the exciton generation layer 63A and the exciton dissociation layer 63B may include materials other than the above-described materials as far as the effects of the present disclosure are achievable.

5. FIFTH EMBODIMENT

FIG. 14 schematically illustrates a cross-sectional configuration of an organic photoelectric convener 70 that configures a solid-state imaging element according to a fifth embodiment of the present disclosure. The organic photoelectric convener 70 includes the pair of electrodes (the bottom-electrode 61 and the top-electrode 64) and a photoelectric conversion layer 73 provided between the pair of electrodes, in the present embodiment, the photoelectric conversion layer 73 differs from the foregoing fourth embodiment in that the photoelectric conversion layer 73 includes an exciton generation layer 73A, an exciton disassociation layer 73B, and an inter-layer 73C (a first inter-layer) provided between the exciton generation layer 73A and the exciton disassociation layer 73B.

The inter-layer 73C prevents a dye material included in the exciton generation layer 73A from being in contact with the second semiconductor material included in the exciton disassociation layer 73B. The inter-layer 73C is configured with use of the first semiconductor material, for example. The inter-layer 73C has a thickness large enough to prevent the dye material from being in contact with the second semiconductor material, and has a thickness in a range from 5 nm to 20 nm, for example.

As described above, in general, the dye material has the low carrier transport performance. In contrast, in the present embodiment, as described above, the inter-layer 73C including the first semiconductor material is provided between the exciton generation layer 73A and the exciton disassociation layer 73B Preventing formation of an interface between the dye material and the second semiconductor material in this manner makes it possible to prevent disassociation of excitons on the dye material. Therefore, an effect of allowing for further enhancement of responsivity and photoelectric conversion efficiency is achieved, in addition to the effects of the foregoing fourth embodiment.

6. SIXTH EMBODIMENT

FIG. 15 schematically illustrates a cross-sectional configuration of a photoelectric convener 80 that configures a solid-state imaging element according to a sixth embodiment of the present disclosure. The photoelectric convener 80 includes the pair of electrodes (the bottom-electrode 61 and the top-electrode 64) and a photoelectric conversion layer 83 provided between the pair of electrodes. The present embodiment differs from the foregoing second and fifth embodiments in that the photoelectric conversion layer 83 includes an exciton generation layer 83A, an exciton disassociation layer 83B, and an inter-layer 83C, and that an inter-layer 83D (a second inter-layer) is further provided between line exciton disassociation layer 83B and the inter-layer 83C. It is to be noted that the inter-layer 83C has a configuration similar to that of the inter-layer 63C in the foregoing fifth embodiment.

The inter-layer 83D includes the first semiconductor material and the second semiconductor material. The inter-layer 83D has a bulk heterojunction interface configured by the first semiconductor material and the second semiconductor material. The inter-layer 83D has a thickness in a range from 5 nm to 50 nm, for example.

In the present embodiment, the inter-layer 83D including the first semiconductor and the second semiconductor is provided between the exciton disassociation layer 83B and the inter-layer 83C, thus increasing an area of an interface where excitons are disassociated, and charges are generated. This enhances separation speed from the excitons to the charges, thus achieving an effect of allowing for further enhancement of responsivity, in addition to the effects of the foregoing fifth embodiment.

7. APPLICATION EXAMPLES

Application Example 1

FIG. 16 illustrates an overall configuration of a solid-state imaging apparatus (the solid-state imaging apparatus 1) that uses, for each of the pixels, the solid-state imaging element (the solid-state imaging element 10, for example) including the organic photoelectric converter 20 (or the organic photoelectric converter 60, 70, or 80) described in the foregoing first to sixth embodiments. The solid-state imaging apparatus 1 is a CMOS image sensor, and includes the pixel unit 1a as an imaging region on the semiconductor substrate 30 and includes, in a peripheral region of the pixel unit 1a, a peripheral circuit unit 130 that includes, for example, a row scanner 131, a horizontal selector 133, a column scanner 134, and a system controller 132.

The pixel unit 1a has a plurality of unit pixels P (each corresponding to the solid-state imaging element 10) two-dimensionally arranged in a matrix, for example. The unit pixels P are wired with pixel drive lines Lread (specifically, row selection lines and reset control lines) for respective pixel rows and vertical signal lines Lsig for respective pixel columns. The pixel drive lines Lread transmit drive signals for signal reading from the pixels. The pixel drive lines each have one end coupled to a corresponding one of output terminals, corresponding to the respective rows, of the row scanner 131.

The row scanner 131 includes a shift register, an address decoder, etc. and is a pixel driver, for example, that drives the respective pixels P in the pixel unit 1a on a row-by-row basis. A signal outputted from each of the pixels P of a pixel row selectively scanned by the row scanner 131 is supplied to the horizontal selector 133 through each of the vertical signal lines Lsig. The horizontal selector 133 includes an amplifier, a horizontal selection switch, etc. provided for each of the vertical signal lines Lsig.

The column scanner 134 includes a shift register, an address decoder, etc., and drives horizontal selection switches of the horizontal selector 133 in sequence while scanning the horizontal selection switches. Such selective scanning by the column scanner 134 causes the signals of the respective pixels transmitted through the respective vertical signal lines Lsig to be outputted in sequence to a horizontal signal line 135 and thereafter transmitted to outside of the semiconductor substrate 30 through the horizontal signal line 135.

Circuit components including the row scanner 131, the horizontal selector 133, the column scanner 134, and the horizontal signal line 135 may be formed directly on the semiconductor substrate 30 or disposed in an external control 1C. Alternatively, the circuit components may be formed by any other substrate coupled by a cable, etc.

The system controller 132 receives a clock given from the outside of the semiconductor substrate 30 or data etc. on instructions of operation modes, and also outputs data such as internal information of the solid-state imaging apparatus 1. The system controller 132 further has a timing generator that generates various timing signals, and performs drive control of the peripheral circuits such as the row scanner 131, the horizontal selector 133, and the column scanner 134, on the basis of the various timing signals generated by the timing generator.

Application Example 2

The foregoing solid-state imaging apparatus 1 is applicable to various kinds of electronic apparatuses having imaging functions. Examples of the electronic apparatuses include camera systems such as digital still cameras and video cameras and mobile phones having the imaging functions. FIG. 17 illustrates, for purpose of an example, a schematic configuration of an electronic apparatus 2 (a camera). The electronic apparatus 2 is a video camera that enables shooting of a still image or a moving image, for example, and includes the solid-state imaging apparatus 1, an optical system (an optical lens) 310, a shutter apparatus 311, a driver 313 that drives the solid-state imaging apparatus 1 and the shutter apparatus 311, and a signal processor 312.

The optical system 310 guides image light (incident light) from an object to the pixel unit 1a of the solid-state imaging apparatus 1. The optical system 310 may include a plurality of optical lenses. The shutter apparatus 311 controls a period in which the solid-state imaging apparatus 1 is irradiated with the light and a period in which the light is blocked. The driver 313 controls a transfer operation of the solid-state imaging apparatus 1 and a shutter operation of the shutter apparatus 311. The signal processor 312 performs various types of signal processing on signals outputted from the solid-state imaging apparatus 1. An image signal Dout having been subjected to the signal processing is stored in a storage medium such as a memory or outputted to a monitor, etc.

Furthermore, the foregoing solid-state imaging element 10 including the organic photoelectronic convener 20 (or the organic photoelectric converter 60, 70, or 80) described in the foregoing first to sixth embodiments is applicable to the following electronic apparatuses (a capsule endoscope 10100, a mobile body of a vehicle, etc.).

Application Example 3

<Application Example to In-vivo Information Acquisition System>

FIG. 18 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil few power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 18, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 101114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

The description has been given above of one example of the in-vivo information acquisition system, to which the technology according to the present disclosure can be applied. The technology according to the present disclosure is applicable to, for example, the image pickup unit 10112 of the configurations described above. This makes it possible to acquire a fine operative image having higher color reproducibility, thereby improving accuracy of an inspection.

Application Example 4

4. APPLICATION EXAMPLE TO ENDOSCOPIC SURGERY SYSTEM

The technology according to the present disclosure is applicable to various products. For example, the technology according to the present disclosure may be applied to an endoscopic surgery system.

FIG. 19 is a view depicting an example of a schematic configuration of an endoscopic surgery system to which the technology according to an embodiment of the present disclosure (present technology) can be applied.

In FIG. 19, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy treatment tool 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body lumen of the patient 11132, and a camera head 11102 connected to a proximal end of the lens barrel 11101. In the example depicted, the endoscope 11100 is depicted which includes as a hard mirror having the lens barrel 11101 of the hard type. However, the endoscope 11100 may otherwise be included as a soft mirror having the lens barrel 11101 of the soft type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body lumen of the patient 11132 through the objective lens. It is to be noted that the endoscope 11100 may be a direct view mirror or may be a perspective view mirror or a side view mirror.

An optical system and an image pickup element are provided in the inside of the camera head 11102 such that reflected light (observation light) front the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy treatment tool 11112 for cautery or incision of a tissue, sealing of a blood vessel or the like. A pneumoperitoneum apparatus 11206 feeds gas into a body lumen of the patient 11132 through the pneumoperitoneum tube 11111 to inflate the body lumen in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the liming of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength experimental examplecy of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 20 is a block diagram depicting an example of a functional configuration of the camera head 11102 and the CCU 11201 depicted in FIG. 19.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11411.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy treatment tool 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden cm the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

In the foregoing, the description has been given of one example of the endoscopic surgery system to which the technology according to the present disclosure can be applied. The technology according to the present disclosure may be applied to the image pickup unit 11402 among the components of the configuration described above. Applying the technology according to the present disclosure to the image pickup unit 11402 makes it possible to obtain a clearer image of the surgical region. Hence, it is possible for the surgeon to confirm the surgical region with certainty.

Note that the description has been given above of the endoscopic surgery system as one example. The technology according to the present disclosure may be applied to any medical system besides the endoscopic surgery system, such as a micrographic surgery system.

Application Example 5

<Application Example to Mobile Body>

The technology (present technology) according to the present disclosure is applicable to various products. For example, the technology according to the present disclosure may be achieved in the form of an apparatus to be mounted to a mobile body of any kind such as an automobile, an electric vehicle, a hybrid electric vehicle, a motorcycle, bicycle, a personal mobility, an airplane, an unmanned aerial vehicle, a vessel, and a robot.

FIG. 21 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 21, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is art optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the slate of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 21, an audio speaker 12061, a display section 12062, and an instrument panel 12063 are illustrated as the output device. The display section 12062 may, for example, include at least one of an on-board display and a head-up display.

FIG. 22 is a diagram depicting an example of the installation position of the imaging section 12031.

In FIG. 22, the imaging section 12031 includes imaging sections 12101, 12102, 12103, 12104, and 12105.

The imaging sections 12101, 12102, 12103, 12104, and 12105 are, for example, disposed at positions on a from nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 22 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

8. EXAMPLES

Example 1

First, after a glass substrate with an ITO electrode as a bottom-electrode was subjected to UV/ozone cleaning, this substrate was moved to an organic vapor deposition chamber, and an interior of the chamber was depressurized to $1 \times 10^{-5}$ Pa or lower. Thereafter, while a substrate holder was rotated, a photoelectric conversion layer including no halogen atom was formed. Then, an upper inter-layer including a halogen-containing molecule as a dopant (a guest) was similarly formed. Specifically, in an experiment 1, a naphthalene diimide-based material expressed by the following formula (5) was used as a host material, a subphthalocyanine-based material expressed by the following formula (6) was used as a guest material, and a doping concentration (volume %) of the guest material was set to 0, 0.01, 0.05, 0.1, 1, 10, and 100 (experimental examples 1 to 7). In an experiment 2, the material expressed by the formula (5) was used as the host material, a subphthalocyanine-based material expressed by the following formula (7) was used as the guest material, and the doping concentration (volume %) of the guest material was set to 0, 0.01, 0.05, 0.1, 1, 10, and 100 (experimental examples 8 to 14). In an experiment 3, the material expressed by the formula (5) was used as the host material, a hexaazatriphenylene-based material expressed by the following formula (8) was used as the guest material, and the doping concentration (volume %) of the guest material was set to 0, 0.01, 0.05, 0.1, 1, 10, and 100 (experimental examples 15 to 21). Next, after ITO was formed as a top-electrode on the upper inter-layer with use of a sputtering method, a silicon nitride (SiN) film was formed as a protective layer on the ITO with use of a CVD method.

[Chem. 4]

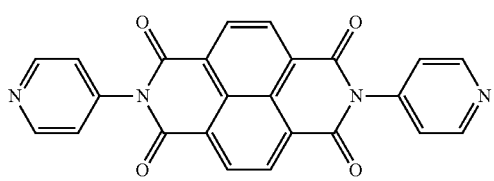

(5)

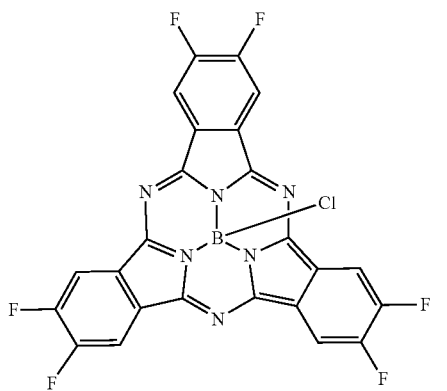

(6)

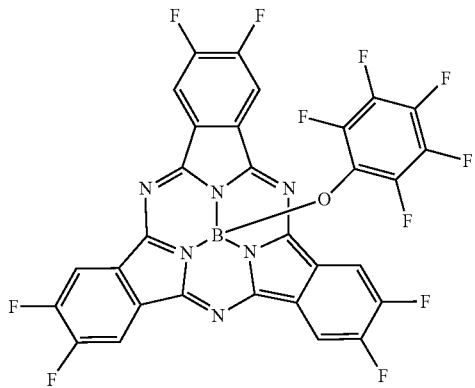

(7)

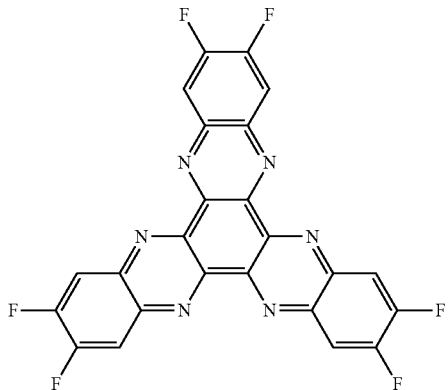

(8)

Tables 1 to 3 are each a summary of the host materials, the guest materials, the concentrations (volume %) of the guest materials, film thicknesses (nm) of the upper inter-layer, and rates (%) of increasing a dark current from before to after formation of the protective layer, which were used in the experimental examples 1 to 7, the experimental examples 8 to 14, and the experimental examples 15 to 21. FIG. 23 to FIG. 25 each illustrate a relation between the doping concentrations and the rate (%) of increasing the dark current from before to after the formation of the protective layer in the experiments 1 to 3. In a case where the dark current before the formation of the protective layer was $J_{dk, 0}$ and the dark current after the formation of the protective layer was $J_{dk}$, the rate $(J_{dk}-J_{dk, 0})/J_{dk, 0}$ of increasing the dark current from before to after the formation of the protective layer increased in a case where the doping concentration was 0.05 volume % or higher irrespective of the kind of the guest material. This has revealed that the halogen-containing molecule included in the upper inter-layer is preferably set to less than 0.05 volume % to suppress an increase in the dark current after the formation of the protective layer.

TABLE 1

| | Host Material | Guest Material | Concentration (Volume %) | Film Thickness (nm) | Rate of Increasing Dark Current (%) |
|---|---|---|---|---|---|
| Experimental Example 1 | Formula (5) | Formula (6) | 0 | 10 | 0.3 |
| Experimental Example 2 | Formula (5) | Formula (6) | 0.01 | 10 | 3 |
| Experimental Example 3 | Formula (5) | Formula (6) | 0.05 | 10 | 12 |
| Experimental Example 4 | Formula (5) | Formula (6) | 0.1 | 10 | 1053 |
| Experimental Example 5 | Formula (5) | Formula (6) | 1 | 10 | 2248 |
| Experimental Example 6 | Formula (5) | Formula (6) | 10 | 10 | 6234 |
| Experimental Example 7 | Formula (5) | Formula (6) | 100 | 10 | 10543 |

TABLE 2

| | Host Material | Guest Material | Concentration (Volume %) | Film Thickness (nm) | Rate of Increasing Dark Current (%) |
|---|---|---|---|---|---|
| Experimental Example 8 | Formula (5) | Formula (7) | 0 | 10 | 0.23 |

TABLE 2-continued

| | Host Material | Guest Material | Concentration (Volume %) | Film Thickness (nm) | Rate of Increasing Dark Current (%) |
|---|---|---|---|---|---|
| Experimental Example 9 | Formula (5) | Formula (7) | 0.01 | 10 | 2.3 |
| Experimental Example 10 | Formula (5) | Formula (7) | 0.05 | 10 | 8 |
| Experimental Example 11 | Formula (5) | Formula (7) | 0.1 | 10 | 13 |
| Experimental Example 12 | Formula (5) | Formula (7) | 1 | 10 | 322 |
| Experimental Example 13 | Formula (5) | Formula (7) | 10 | 10 | 237 |
| Experimental Example 14 | Formula (5) | Formula (7) | 100 | 10 | 534 |

TABLE 3

| | Host Material | Guest Material | Concentration (Volume %) | Film Thickness (nm) | Rate of Increasing Dark Current (%) |
|---|---|---|---|---|---|
| Experimental Example 15 | Formula (5) | Formula (8) | 0 | 10 | 0.9 |
| Experimental Example 16 | Formula (5) | Formula (8) | 0.01 | 10 | 1.2 |
| Experimental Example 17 | Formula (5) | Formula (8) | 0.05 | 10 | 2 |
| Experimental Example 18 | Formula (5) | Formula (8) | 0.1 | 10 | 13 |
| Experimental Example 19 | Formula (5) | Formula (8) | 1 | 10 | 322 |
| Experimental Example 20 | Formula (5) | Formula (8) | 10 | 10 | 592 |
| Experimental Example 21 | Formula (5) | Formula (8) | 100 | 10 | 848 |

Example 2

First, after a glass substrate with an ITO electrode as a bottom-electrode was subjected to UV/ozone cleaning, this substrate was moved to an organic vapor deposition chamber, and an interior of the chamber was depressurized to $1\times10^{-5}$ Pa or lower. Thereafter, while a substrate holder was rotated, as a photoelectric conversion layer, films of an electron donor material, an electron acceptor material, and a dye material were formed by means of vacuum co-evaporation to have a film thickness ratio of 4:2:4 and a total film thickness of 230 nm. Then, after an upper inter-layer containing no halogen atom was formed by means of vacuum deposition, similarly to Example 1, a top-electrode and a protective layer were formed in order, in this example, as the dye material, a subphthalocyanine-based material expressed by the following formula (9) (an experimental example 22), the material expressed by the formula (6) (an experimental example 23), a subphthalocyanine-based material expressed by the following formula (10) (an experimental example 24), the material expressed by the formula (7) (an experimental example 25), a subphthalocyanine-based material expressed by the following formula (11) (an experimental example 26), and a subphthalocyanine-based material expressed by the following formula (12) (an experimental example 27) were used. The same material was used for the electron donor material, the electron acceptor material and the upper inter-layer.

[Chem. 5]

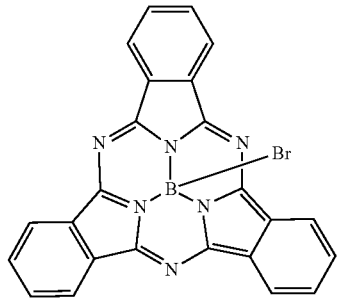
(9)

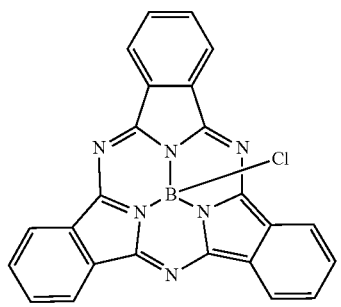
(10)

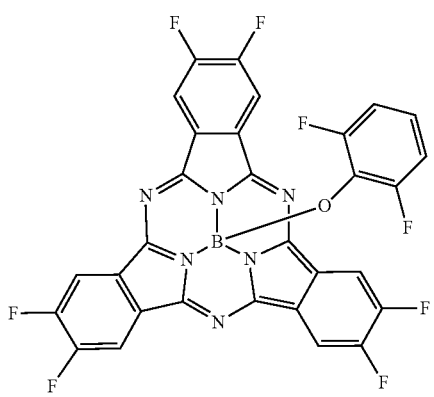
(11)

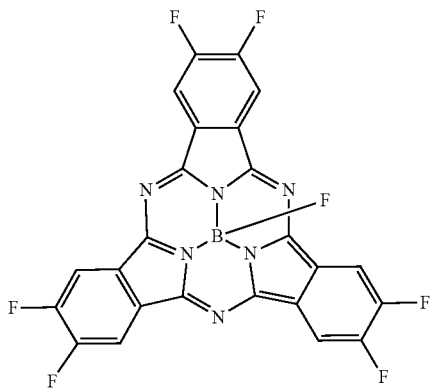
(12)

Table 4 is a summary of the dye materials, the materials of the upper inter-layer, minimum binding energy (eV) of a halogen atom in a molecule of the dye material, and the rate (%) of increasing the dark current from before to after the formation of the protective layer, each of which was used in the experimental examples 22 to 27. FIG. 26 illustrates a relation between the minimum binding energy and the rate of increasing the dark current from before to after the formation of the protective layer. From an examination of dependence of the rate (%) of increasing the dark current from before to after the formation of the protective layer on the dye material, a correlation was observed between the minimum binding energy of the halogen atom and the rate of increasing the dark current in binding having a halogen contained in the molecule of the dye material. This has revealed that in a case where the halogen-containing molecule is present in the photoelectric conversion layer and the minimum binding energy of the binding having the halogen atom is 5.4 eV or higher, an increase in the dark current after the formation of the protective layer is suppressed. It is to be noted that binding disassociation energy was computed by calculation of an energy change in reaction expressed by the following formula (1). A density functional theory was used as a calculation method. B3LYP was used for a functional and 6-31G** was used for a basis function.

[Math. 1]

$$AB \rightarrow A \cdot + B \cdot \quad (1)$$

TABLE 4

| | Dye Material | Upper Inter-layer | Minimum Binding Energy (eV) | Rate of Increasing Dark Current (%) |
| --- | --- | --- | --- | --- |
| Experimental Example 22 | Formula (9) | Formula (5) | 4.54 | 4536 |
| Experimental Example 23 | Formula (6) | Formula (5) | 4.93 | 832 |
| Experimental Example 24 | Formula (10) | Formula (5) | 4.95 | 2454 |
| Experimental Example 25 | Formula (7) | Formula (5) | 5.37 | 53 |
| Experimental Example 26 | Formula (11) | Formula (5) | 5.5 | 33 |
| Experimental Example 27 | Formula (12) | Formula (5) | 7.15 | 60 |

Example 3

First, after a glass substrate with an ITO electrode as a bottom-electrode was subjected to UV/ozone cleaning, this substrate was moved to an organic vapor deposition chamber and an interior of the chamber was depressurized to 1×10−5 Pa or lower. Thereafter, while the substrate holder was rotated, as a photoelectric conversion layer, films of an electron donor material, an electron acceptor material, and a dye material were formed by means of vacuum co-evaporation to have a film thickness ratio of 4:2:4 and a total film thickness of 230 nm. Then, after an upper inter-layer containing no halogen atom was formed by means of vacuum deposition, similarly to Example 1, a top-electrode and a protective layer were formed in order. In this example, as a material of the upper inter-layer, the material expressed by the formula (5) (an experimental example 28), a naphthalene diimide-based material expressed by the following formula (13) (an experimental example 29), a naphthalene diimide-based material expressed by the following formula (14) (an experimental example 30), a naphthalene diimide-based material expressed by the following formula (15) (an experimental example 31), a naphthalene-1,4,5,8-tetracarboxylic dianhydride (an experimental example 32), a naphthalene diimide-based material expressed by the following formula (17) (an experimental example 33), molybdenum oxide (MoO$_3$) (an experimental example 34), tungsten oxide (WO$_3$) (an experimental example 35), a hexaazatriphenylene-based material expressed by the following formula (18) (an experimental example 36), and the material expressed by the formula (5) (an experimental example 37) were used. The same material was used for the electron donor material, the electron acceptor material, and the upper inter-layer.

[Chem. 6]

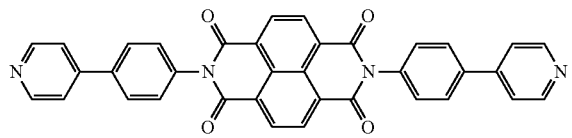

(13)

(14)

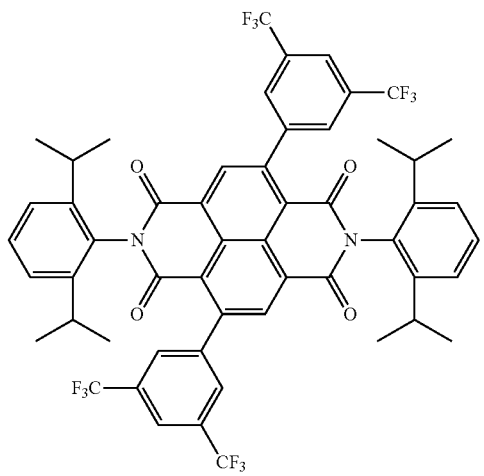

(15)

(16)

-continued

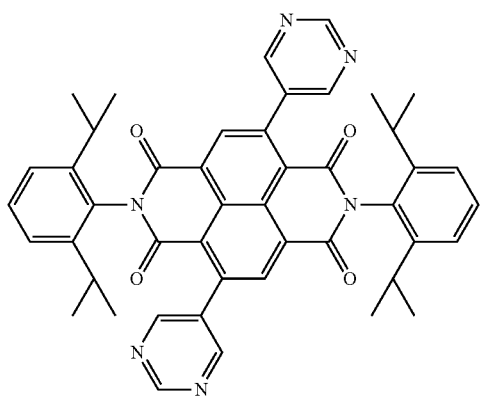

(17)

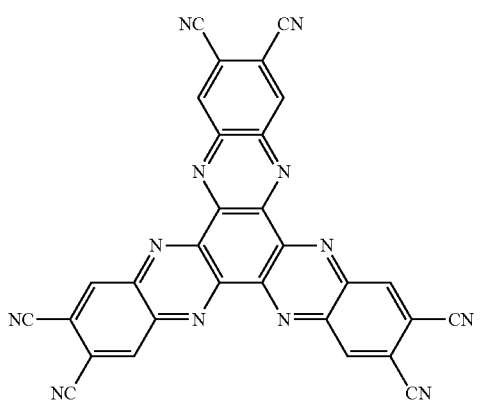

(18)

Table 5 is a summary of work functions of the top-electrodes in the experimental examples 28 to 37, electron affinity (eV) of the upper inter-layer and the photoelectric conversion layer, relative values of the dark current, and relative values of quantum efficiency, each of which is in the experimental examples 28 to 37. FIG. 27 illustrates a relation of the electron affinity of the upper inter-layer and the dark current in the experimental examples 28 to 33. FIG. 28 illustrates a relation of the electron affinity of the upper inter-layer and the quantum efficiency in the experimental examples 28 to 33. FIG. 29 illustrates a relation of the electron affinity of the upper inter-layer and the dark current in the experimental examples 34 to 37. FIG. 30 illustrates a relation of the electron affinity of the upper inter-layer and the quantum efficiency in the experimental examples 34 to 37.

In this example, dependence of the upper inter-layer on the dark current relative value after the formation of the protective layer and the quantum efficiency relative value was examined. It is to be noted that the quantum efficiency was evaluated by application of green light having an excitation wavelength of 560 nm and intensity of 10 µW/cm². The work function of the top-electrode was acquired with use of an ultraviolet photoelectron spectroscopy method. The electron affinity of each of the materials of the upper inter-layer and the photoelectric conversion layer was computed through subtracting an ionization potential obtained by the ultraviolet photoelectron spectroscopy method and an optical bandgap obtained by absorption spectroscopy measurement. As a result, it has been revealed that it is possible to establish both a low dark current and high quantum efficiency in a case where the top-electrode is a cathode and the upper inter-layer that satisfies EA2≤EA1≤WF is used where the work function of the top-electrode is WF, the electron affinity of the upper inter-layer is EA1, and electron affinity of a material having the smallest electron affinity of the photoelectric conversion materials is EA2. In addition, it has been revealed that in a case where the top-electrode is an anode, it is possible to establish both a low dark current and high quantum efficiency in a case where EA1>WF.

TABLE 5

| | Top-electrode | | | Upper Inter-layer | | Electron Affinity of Photoelectric Conversion Layer Material (eV) | | | Dark Current | Quantum Efficiency |
| | | | | | | | | | | |
| | Material | Polarity | Work Function | Material | Electron Affinity (eV) | Electron Donor Material | Electron Dye Material | Electron Acceptor Material | Relative Value | Relative Value |
|---|---|---|---|---|---|---|---|---|---|---|
| Experimental Example 28 | ITO | Cathode | 4.8 | Formula (5) | 4.8 | 2.5 | 4.5 | 4.5 | 1 | 1 |
| Experimental Example 29 | ITO | Cathode | 4.8 | Formula (13) | 4.3 | 2.5 | 4.5 | 4.5 | 1.29 | 0.71 |
| Experimental Example 30 | ITO | Cathode | 4.8 | Formula (14) | 4.7 | 2.5 | 4.5 | 4.5 | 1.36 | 1.01 |
| Experimental Example 31 | ITO | Cathode | 4.8 | Formula (15) | 5.4 | 2.5 | 4.5 | 4.5 | 11.3 | 0.99 |
| Experimental Example 32 | ITO | Cathode | 4.8 | Formula (16) | 4.9 | 2.5 | 4.5 | 4.5 | 3.78 | 1 |
| Experimental Example 33 | ITO | Cathode | 4.8 | Formula (17) | 4.5 | 2.5 | 4.5 | 4.5 | 0.95 | 0.98 |
| Experimental Example 34 | ITO | Anode | 4.8 | MoO₃ | 6.7 | 2.5 | 4.5 | 4.5 | 1 | 1 |
| Experimental Example 35 | ITO | Anode | 4.8 | WO₃ | 6.5 | 2.5 | 4.5 | 4.5 | 1 | 1.02 |
| Experimental Example 36 | ITO | Anode | 4.8 | Formula (18) | 5.6 | 2.5 | 4.5 | 4.5 | 1.19 | 0.99 |
| Experimental Example 37 | ITO | Anode | 4.8 | Formula (5) | 4.8 | 2.5 | 4.5 | 4.5 | 21 | 0.7 |

Example 4

First, after a glass substrate with an ITO electrode as a bottom-electrode was subjected to UV/ozone cleaning, this substrate was moved to an organic vapor deposition chamber and an interior of the chamber was depressurized to $1*10^{-5}$ Pa or lower. Thereafter, while a substrate holder was rotated, as a photoelectric conversion layer, films of an electron donor material, an electron acceptor material, and a dye material having a halogen atom in a molecule were formed by means of vacuum co-evaporation to have a film thickness ratio of 4:2:4 and a total film thickness of 230 nm. Then, an upper inter-layer containing no halogen atom was formed by means of vacuum deposition. At that time, a film thickness of the upper inter-layer was set to 3 nm (an experimental example 38), 5 nm (an experimental example 39), 7 nm (an experimental example 40), 10 nm (an experimental example 41), 15 nm (an experimental example 42), and 20 nm (an experimental example 43). Thereafter, similarly to Example 1, a top-electrode and a protective layer were formed in order. In this example, the material expressed by the formula (7) was used as the dye material, and the material expressed by the formula (5) was used as the upper inter-layer. In addition, in all the experimental examples, the same material was used for the electron donor material and the electron acceptor material.

Table 6 is a summary of the dye material, the material of the upper inter-layer, the film thickness (nm) of the upper inter-layer, and the rate (%) of increasing the dark current from before to after the formation of the protective layer, each of which is in the experimental examples 34 to 43. FIG. 31 illustrates the film thickness of the upper inter-layer, that is, a relation of a distance between the photoelectric conversion layer and the top-electrode and the rate $(J_{dk}-J_{dk, 0})J_{dk, 0}$ of increasing the dark current from before to after the formation of the protective layer. It has been revealed from the result of Example 2 that even though no halogen-containing molecule is included in the upper inter-layer, desorption of the halogen atom occurs to no small extent during formation of the top-electrode or the protective layer, in a case where the halogen-containing molecule is included in the photoelectric conversion layer, which thus results in an increase in dark current. This is assumed to be attributable to penetration, into the photoelectric conversion layer, of ultraviolet rays generated upon formation of the top-electrode or the protective layer, for example.

TABLE 6

|  | Dye Material | Upper Inter-layer | Film Thickness (nm) | Rate of Increasing Dark Current (%) |
|---|---|---|---|---|
| Experimental Example 38 | Formula (7) | Formula (5) | 3 | 847 |
| Experimental Example 39 | Formula (7) | Formula (5) | 5 | 1 |
| Experimental Example 40 | Formula (7) | Formula (5) | 7 | 0.8 |
| Experimental Example 41 | Formula (7) | Formula (5) | 10 | 0.3 |
| Experimental Example 42 | Formula (7) | Formula (5) | 15 | 1 |
| Experimental Example 43 | Formula (7) | Formula (5) | 20 | 0.8 |

An examination of the dependence, on the film thickness of the upper inter-layer, of the rate of increasing the dark current from before to after the formation of the protective layer has revealed that the increase in the dark current after the formation of the protective layer is suppressed through making the film thickness 5 nm or larger, that is, making the distance from the top-electrode to the photoelectric conversion layer including the halogen-containing molecule 5 nm or larger.

Although the description has been given with reference to the foregoing first and sixth embodiments, the application examples, and the examples, the content of the present disclosure is not limited to the foregoing embodiments, etc., and may be modified in a variety of ways. For example, although the photoelectric conversion element in the foregoing first embodiment has a configuration in which the organic photoelectric converter 20 detecting the green light and the inorganic photoelectric conveners 32B and 32R respectively detecting blue light and red light are stacked, the contents of the present disclosure are not limited to such a configuration. That is, the organic photoelectric convener may detect red light or blue light, and the inorganic photoelectric converter may detect green light.

In addition, the number of organic photoelectric converters, the number of inorganic photoelectric converters, a ratio between the organic photoelectric converters and the inorganic photoelectric converters are not limited, and two or more organic photoelectric converters may be provided, or color signals of a plurality of colors may be obtained by only the organic photoelectric converter. Further, the content of the present disclosure is not limited to a configuration in which organic photoelectric converters and inorganic photoelectric converters are stacked in the longitudinal direction, and organic photoelectric converters and inorganic photoelectric converters may be disposed side by side along a substrate surface.

Furthermore, in the foregoing first embodiment, the configuration of the back-side illumination type solid-state imaging apparatus has been exemplified; however, the contents of the present disclosure are applicable to a front-side illumination type solid-state imaging apparatus. In addition, it is not necessary that the solid-state imaging element (and the imaging apparatus) of the present disclosure include all of the respective components described in the foregoing embodiments, and or may include any other layer.

It is to be noted that the effects described herein are merely illustrative and non-limiting, and other effects may be included.

Moreover, the present disclosure may have the following configurations.

(1)

A solid-state imaging element including:
a bottom-electrode;
a top-electrode opposed to the bottom-electrode;
a photoelectric conversion layer provided between the bottom-electrode and the top-electrode and including a first organic semiconductor material; and
an upper inter-layer provided between the top-electrode and the photoelectric conversion layer, and including a second organic semiconductor material having a halogen atom in a molecule at a concentration in a range from 0 volume % or more to less than 0.05 volume %.

(2)

The solid-state imaging element according to (1), in which the first organic semiconductor material includes one or two or more halogen atoms in the molecule, and binding energy of a halogen atom having smallest binding energy in the molecule is 5.4 eV or higher.

(3)

The solid-state imaging element according to (1) or (2), in which the photoelectric conversion layer includes a third organic semiconductor material or a fourth organic semiconductor material or both, the third organic semiconductor material serving as an electron donor to the first organic semiconductor material and the fourth organic semiconductor material serving as an electron acceptor to the first organic semiconductor material.

(4)

The solid-state imaging element according to any of (1) to (3), in which the first organic semiconductor material is a boronated subphthalocyanine derivative.

(5)

The solid-state imaging element according to any of (2) to (4), in which in a case where the top-electrode functions as a cathode, a work function (WF) of the lop-electrode, electron affinity of the upper inter-layer (EA1), and electron affinity of a material having smallest electron affinity of materials included in the photoelectric conversion layer (EA2) satisfy EA2≤EA1≤WF.

(6)

The solid-state imaging element according to any of (2) or (5), in which in a case where the top-electrode functions as an anode, the work function (WF) of the top-electrode and the electron affinity of the upper inter-layer (EA1) satisfy EA1>WF.

(7)

The solid-state imaging element according to any of (1) to (6), in which a distance between the top-electrode and the photoelectric conversion layer is in a range from 5 nm to 20 nm both inclusive.

(8)

The solid-state imaging element according to any of (1) to (7), in which the top-electrode is formed including one or more kinds of indium tin oxide (ITO), indium zinc oxide (IZO), and indium-tungsten oxide (IWO).

(9)

The solid-state imaging element according to any of (1) to (8), in which an organic photoelectric converter including one or a plurality of the photoelectric conversion layers, and one or a plurality of inorganic photoelectric converters are slacked, the inorganic photoelectric conveners performing, photoelectric conversion in, a different wavelength range from the organic photoelectric converter.

(10)

The solid-state imaging element according to any of (9), in which the inorganic photoelectric convener is formed to be embedded in a semiconductor substrate, and the organic photoelectric converter is formed on a side on which, a first surface is located of the semiconductor substrate.

(11)

A solid-state imaging element including:

a bottom-electrode;

a top-electrode opposed to the bottom-electrode;

a photoelectric conversion layer provided between the bottom-electrode and the top-electrode and including an organic semiconductor material that has one or two or more halogen, atoms in a molecule and in which binding energy of a halogen atom having smallest binding energy in the molecule is 5.4 eV or higher; and an upper inter-layer provided between the top-electrode and the photoelectric conversion layer.

(12)

A solid-state imaging element including:

a bottom-electrode;

a top-electrode opposed to the bottom-electrode;

a photoelectric conversion layer provided between the bottom-electrode and the top-electrode and including an organic semiconductor material having a halogen atom in a molecule; and an organic semiconductor layer provided between the top-electrode and the photoelectric conversion layer, wherein a distance between the top-electrode and the photoelectric conversion layer is in a range from 5 nm to 20 nm both inclusive.

(13)

A solid-state imaging element including:

a first electrode;

a second electrode opposed to the first electrode; and a photoelectric conversion layer provided between the first electrode and the second electrode, in which the photoelectric conversion layer includes an exciton generation layer including a dye material and a first semiconductor material, and an exciton disassociation layer including a second semiconductor material.

(14)

The solid-state imaging element according to (13), in which the photoelectric conversion layer includes a first inter-layer including a first semiconductor material between the exciton generation layer and the exciton disassociation layer.

(15)

The solid-state imaging element according to (14), in which the photoelectric conversion layer includes a second inter-layer including the first semiconductor material and the second semiconductor material between the first inter-layer and the exciton disassociation layer.

(16)

The solid-slate imaging element according to any of (13) to (15), in which the first semiconductor material and the second semiconductor material are semiconductor materials having mutually different polarities.

(17)

The solid-state imaging element according to any of (13) to (16), in which a bandgap of the first semiconductor material is equal to a bandgap of the dye material or smaller than the bandgap of the dye material.

(18)

The solid-state imaging element according to any of (13) to (17), in which the first semiconductor material and the second semiconductor material have a difference in energy level.

(19)

The solid-slate imaging element according to any of (13) to (18), in which the second semiconductor material forms an interface with the first semiconductor material and is not in direct contact with the dye material.

(20)

The solid-state imaging element according to any of (13) to (19), in which the dye material, the first semiconductor material, and the second semiconductor material are organic materials.

(21)

A solid-state imaging apparatus provided with a plurality of pixels each including one or a plurality of solid-slate imaging elements, each of the solid-state imaging elements including;

a bottom-electrode;

a top-electrode opposed to the bottom-electrode;

a photoelectric conversion layer provided between the bottom-electrode and the top-electrode and including a first organic semiconductor material; and an upper inter-layer provided between the top-electrode and the photoelectric conversion layer, and including a second organic semiconductor material having a halogen atom in a molecule at a concentration in a range from 0 volume % or more to less than 0.05 volume %.

(22)

A solid-state imaging apparatus provided with a plurality of pixels each including one or a plurality of solid-state imaging elements, each of the solid-state imaging elements including:

a bottom-electrode; and
a top-electrode opposed to the bottom-electrode;
a photoelectric conversion layer provided between the bottom-electrode and the top-electrode and including an organic semiconductor material that has one or two or more halogen atoms in a molecule and in which binding energy of a halogen atom having smallest binding energy in the molecule is 5.4 eV or higher; and
an upper inter-layer provided between the top-electrode and the photoelectric conversion layer.

(23)

A solid-state imaging apparatus provided with a plurality of pixels each including one or a plurality of solid-state imaging elements, each of the solid-state imaging elements comprising:

a bottom-electrode;
a top-electrode opposed to the bottom-electrode;
a photoelectric conversion layer provided between the bottom-electrode and the top-electrode and including an organic semiconductor material having a halogen atom in a molecule; and
an organic semiconductor layer provided between the top-electrode and the photoelectric conversion layer, in which
a distance between the top-electrode and the photoelectric conversion layer is in a range from 5 nm to 20 nm both inclusive.

(24)

A solid-state imaging apparatus provided with a plurality of pixels each including one or a plurality of solid-state imaging elements, each of the solid-state imaging elements comprising:

a first electrode;
a second electrode opposed to the first electrode, and
a photoelectric conversion layer provided between the first electrode and the second electrode, wherein
the photoelectric conversion layer includes an exciton generation layer including a dye material and a first semiconductor material, and an exciton disassociation layer including a second semiconductor material.

This application claims the benefits of Japanese Priority Patent Application No. 2016-142154 filed on Jul. 20, 2016 and Japanese Priority Patent Application No. 2016-155728 filed on Aug. 8, 2016, the entire contents of which are incorporated herein by reference.

It should be understood that those skilled in the art could conceive various modifications, combinations, sub-combinations, and alterations depending on design requirements and other factors, insofar as they are within the scope of the appended claims or the equivalents thereof.

What is claimed is:

1. A solid-state imaging element comprising:
a bottom-electrode;
a top-electrode opposed to the bottom-electrode;
a photoelectric conversion layer provided between the bottom-electrode and the top-electrode and including a first organic semiconductor material; and
an upper inter-layer provided between the top-electrode and the photoelectric conversion layer, and including a second organic semiconductor material having a halogen atom in a molecule, wherein a concentration of the second organic semiconductor material is less than 0.05 volume % of the upper inter-layer.

2. The solid-state imaging element according to claim 1, wherein the first organic semiconductor material includes one or two or more halogen atoms in the molecule, and a binding energy of a halogen atom having smallest binding energy in the molecule is 5.4 eV or higher.

3. The solid-state imaging element according to claim 1, wherein the photoelectric conversion layer includes a third organic semiconductor material or a fourth organic semiconductor material or both, the third organic semiconductor material serving as an electron donor to the first organic semiconductor material and the fourth organic semiconductor material serving as an electron acceptor to the first organic semiconductor material.

4. The solid-state imaging element according to claim 1, wherein the first organic semiconductor material is a boronated subphthalocyanine derivative.

5. The solid-state imaging element according to claim 2, wherein in a case where the top-electrode functions as a cathode, a work function (WF) of the top-electrode, an electron affinity of the upper inter-layer (EA1), and an electron affinity of a material having smallest electron affinity of materials included in the photoelectric conversion layer (EA2) satisfy EA2≤EA1≤WF.

6. The solid-state imaging element according to claim 2, wherein in a case where the top-electrode functions as an anode, the work function (WF) of the top-electrode and the electron affinity of the upper inter-layer (EA1) satisfy EA1>WF.

7. The solid-state imaging element according to claim 1, wherein a distance between the top-electrode and the photoelectric conversion layer is in a range from 5 nm to 20 nm, both inclusive.

8. The solid-state imaging element according to claim 1, wherein the top-electrode is formed including one or more kinds of indium tin oxide (ITO), indium zinc oxide (IZO), and indium-tungsten oxide (IWO).

9. The solid-state imaging element according to claim 1, wherein an organic photoelectric converter including one or a plurality of the photoelectric conversion layers, and one or a plurality of inorganic photoelectric converters are stacked, the inorganic photoelectric converters performing photoelectric conversion in a different wavelength range from the organic photoelectric converter.

10. The solid-state imaging element according claim 9, wherein
the inorganic photoelectric converter is formed to be embedded in a semiconductor substrate, and
the organic photoelectric converter is formed on a side on which a first surface is located of the semiconductor substrate.

11. A solid-state imaging element comprising:
a bottom-electrode;
a top-electrode opposed to the bottom-electrode;
a photoelectric conversion layer provided between the bottom-electrode and the top-electrode and including an organic semiconductor material having a halogen atom in a molecule; and
an organic semiconductor layer provided between the top-electrode and the photoelectric conversion layer, wherein
a distance between the top-electrode and the photoelectric conversion layer is in a range from 5 nm to 20 nm, both inclusive.

12. A solid-state imaging apparatus provided with a plurality of pixels each including one or a plurality of solid-state imaging elements, each of the solid-state imaging elements comprising:
- a bottom-electrode;
- a top-electrode opposed to the bottom-electrode;
- a photoelectric conversion layer provided between the bottom-electrode and the top-electrode and including a first organic semiconductor material; and
- an upper inter-layer provided between the top-electrode and the photoelectric conversion layer, and including a second organic semiconductor material having a halogen atom in a molecule, wherein a concentration of the second organic semiconductor material is less than 0.05 volume % of the upper inter-layer.

13. A solid-state imaging apparatus provided with a plurality of pixels each including one or a plurality of solid-state imaging elements, each of the solid-state imaging elements comprising:
- a bottom-electrode;
- a top-electrode opposed to the bottom-electrode;
- a photoelectric conversion layer provided between the bottom-electrode and the top-electrode and including an organic semiconductor material having a halogen atom in a molecule; and
- an organic semiconductor layer provided between the top-electrode and the photoelectric conversion layer, wherein
- a distance between the top-electrode and the photoelectric conversion layer is in a range from 5 nm to 20 nm, both inclusive.

* * * * *